United States Patent
Muramatsu et al.

(10) Patent No.: US 7,868,451 B2
(45) Date of Patent: Jan. 11, 2011

(54) RESIN SEALING SEMICONDUCTOR DEVICE AND ELECTRONIC DEVICE USING RESIN SEALING SEMICONDUCTOR DEVICE

(75) Inventors: Shuichi Muramatsu, Numazu (JP); Hidetoshi Suzuki, Numazu (JP); Tomoyuki Sato, Numazu (JP); Kazuo Hara, Numazu (JP)

(73) Assignee: Kokusan Denki Co. Ltd., Shizuoka (JP)

( * ) Notice: Subject to any disclaimer, the term of this patent is extended or adjusted under 35 U.S.C. 154(b) by 157 days.

(21) Appl. No.: 12/302,376

(22) PCT Filed: May 30, 2006

(86) PCT No.: PCT/JP2006/310783

§ 371 (c)(1),
(2), (4) Date: Nov. 25, 2008

(87) PCT Pub. No.: WO2007/138681

PCT Pub. Date: Dec. 6, 2007

(65) Prior Publication Data

US 2009/0201651 A1    Aug. 13, 2009

(51) Int. Cl.
*H01L 23/34* (2006.01)
(52) U.S. Cl. .............. 257/723; 257/E23.051; 257/701; 257/706; 257/730; 438/107; 438/122; 361/746
(58) Field of Classification Search .......... 257/E23.051, 257/E23.092, E23.031, 701, 704, 706, 709, 257/710, 712, 713, 717, 720, 723–725, 730–733, 257/735, 739, 787; 438/107, 109, 110, 122; 361/746, 761; 174/257, 260
See application file for complete search history.

(56) References Cited

U.S. PATENT DOCUMENTS 5,440,169 A * 8/1995 Tomita et al. ............... 257/667

(Continued)

FOREIGN PATENT DOCUMENTS

JP      6-97323 A      4/1994

(Continued)

OTHER PUBLICATIONS

International Search Report dated Jul. 4, 2006.

*Primary Examiner*—Chris Chu
(74) *Attorney, Agent, or Firm*—Pearne & Gordon LLP

(57) ABSTRACT

A resin sealing semiconductor device (2) having a structure in which a portion to be sealed of components including a plurality of chip mounting board, a semiconductor chip mounted to a front surface of each chip mounting board, and a plurality of leads provided correspondingly to each chip mounting board is embedded in resin molded portions (41 and 42) molded into a generally plate shape, and outer lead portions of the plurality of leads (16 and 17) are led out in line from a side surface at one end in a width direction of the resin molded portions, and back surfaces as exposed surfaces ($11u1$ to $11w1$ and $12u1$ to $12w1$) of each chip mounting board are placed on one surfaces of the resin molded portions (41 and 42), wherein a plurality of positioning protrusions (50) are provided on one surfaces of the resin molded portions (41 and 42), and a protrusion height of the positioning protrusions is set so that a gap to be filled with insulating resin is formed between each part of the exposed surface of each chip mounting board and a radiator plate when the positioning protrusions (50) are abutted against the radiator plate.

14 Claims, 9 Drawing Sheets

U.S. PATENT DOCUMENTS

| | | | |
|---|---|---|---|
| 5,559,374 A * | 9/1996 | Ohta et al. | 257/723 |
| 5,646,445 A * | 7/1997 | Masumoto et al. | 257/723 |
| 5,686,758 A * | 11/1997 | Arai et al. | 257/693 |
| 5,747,875 A * | 5/1998 | Oshima | 257/687 |
| 5,796,160 A * | 8/1998 | Kozono | 257/675 |
| 5,920,119 A * | 7/1999 | Tamba et al. | 257/718 |
| 5,942,797 A * | 8/1999 | Terasawa | 257/723 |
| 5,986,336 A * | 11/1999 | Tomita | 257/675 |
| 6,291,880 B1 * | 9/2001 | Ogawa et al. | 257/723 |
| 6,432,750 B2 * | 8/2002 | Jeon et al. | 438/122 |
| 6,521,983 B1 * | 2/2003 | Yoshimatsu et al. | 257/678 |
| 6,700,194 B2 * | 3/2004 | Nakajima et al. | 257/707 |
| 6,809,410 B2 * | 10/2004 | Yamada | 257/678 |
| 7,208,819 B2 * | 4/2007 | Jeun et al. | 257/666 |
| 7,679,182 B2 * | 3/2010 | Yoshinari et al. | 257/706 |
| 2003/0006501 A1 * | 1/2003 | Waki et al. | 257/707 |
| 2005/0104168 A1 * | 5/2005 | Choi et al. | 257/666 |
| 2010/0103634 A1 * | 4/2010 | Funaya et al. | 361/761 |

FOREIGN PATENT DOCUMENTS

| | | |
|---|---|---|
| JP | 11-220074 A | 8/1999 |
| JP | 2002-110867 A | 4/2002 |

* cited by examiner

RESIN SEALING SEMICONDUCTOR DEVICE AND ELECTRONIC DEVICE USING RESIN SEALING SEMICONDUCTOR DEVICE

TECHNICAL FIELD OF THE INVENTION

The present invention relates to a resin sealing semiconductor device suitable for comprising a power circuit and an electronic device using the semiconductor device.

PRIOR ART OF THE INVENTION

A resin sealing semiconductor device that comprises a power circuit includes a metal chip mounting board, a plurality of leads, a semiconductor chip mounted on a surface of the chip mounting board, a connecting wire that connects between an electrode of the semiconductor chip and an inner lead portion of a lead, and a resin molded portion that covers the semiconductor chip, the connecting wire, the inner lead portion of the lead, and the chip mounting board as disclosed in Japanese Patent Application Laid-Open No. 7-169891 and Japanese Patent Application Laid-Open No. 2002-334811. When the electrode is formed on one surface of the semiconductor chip, the electrode on one surface of the chip is often soldered to the chip mounting board. In such a semiconductor device, a lead frame having a structure in which a plurality of chip mounting boards and leads corresponding to the chip mounting boards are connected to each other is used for efficient production of the semiconductor device. In the lead frame, each chip mounting board is referred to as an island. The resin molded portion is provided with the entire chip mounting board (island) covered in some cases, and provided with part of the chip mounting board exposed on one surface of the resin molded portion in other cases.

In a semiconductor device that comprises a power circuit including a semiconductor chip through which a large current flows such as a semiconductor device that comprises a rectifier power supply circuit, a large amount of heat is generated from the semiconductor chip, and thus a radiator plate is mounted to an exposed surface of a chip mounting board as disclosed in Japanese Patent Application Laid-Open No. 5-304232. The radiator plate is generally mounted to the semiconductor device by soldering or screwing. When a resin sealing semiconductor device with an exposed back surface (surface opposite from a surface to which a semiconductor chip is secured) of a chip mounting board to which the semiconductor chip is electrically connected is mounted to a radiator plate, however, the exposed surface of the chip mounting board is connected to the radiator plate via insulating resin such as an epoxy adhesive for electrical insulation between the chip mounting board and the radiator plate as disclosed in Japanese Patent Application Laid-Open No. 5-304232.

When the insulating resin is provided between the exposed surface of the chip mounting board of the resin sealing semiconductor device and the radiator plate, a gap between the exposed surface of the chip mounting board and the radiator plate needs to be controlled. Too narrow a gap between the exposed surface of the chip mounting board and the radiator plate reduces a voltage-resistance property, and too wide a gap excessively increases a thickness of a resin layer to reduce a heat dissipation property. Particularly in a semiconductor device including a semiconductor chip through which a large current flows, an increase in thickness of an insulation resin layer provided between an exposed surface of a chip mounting board to which a semiconductor chip that generates a large amount of heat is mounted and a radiator plate locally increases a temperature in that part, which causes poor temperature balance between parts in a semiconductor device, abnormally increases a temperature of a particular part, and may cause breakage of the device. Even if an element is not broken, a temperature of a particular element becomes higher than that of other elements to cause differences in characteristics of the elements, which may cause malfunction of the device depending on a circuit construction of the semiconductor device.

When a plurality of chip mounting boards to which heat generating elements are mounted are placed in parallel in a resin molded portion, good temperature balance is sometimes obtained in the case where a thickness of a resin layer provided between a chip mounting board placed in a position where a temperature easily increases (for example, a position where other chip mounting boards are placed on both sides) and a radiator plate is thinner than that of a resin layer provided between other chip mounting boards and the radiator plate rather than the case where the thickness of the resin layer provided between the radiator plate and the exposed surface of the chip mounting board is uniform.

As described above, for eliminating the risk of breakage or malfunction of the semiconductor device and increasing reliability of the semiconductor device, the thickness of the resin layer provided between the chip mounting board and the radiator plate needs to be considered. In either of the case where the thickness of the resin layer provided between the chip mounting board and the radiator plate is uniform or the case where the thickness of the resin layer is changed at different parts, the gap between the exposed surface of the chip mounting board and the radiator plate needs to be strictly controlled in mounting the semiconductor device to the radiator plate.

However, in the conventional semiconductor device, easy control of the gap between the exposed surface of the chip mounting board and the radiator plate is not considered, and thus if the thickness of the resin layer between the chip mounting board and the radiator plate is to be considered in mounting the semiconductor device to the radiator plate, a control operation of the gap between the exposed surface of the chip mounting board and the radiator plate takes time, which inevitably increases production costs of the electronic device into which the semiconductor device is incorporated.

SUMMARY OF THE INVENTION

An object of the present invention is to provide a resin sealing semiconductor device that can easily control a gap between an exposed surface of a chip mounting board (island) and a radiator plate in mounting the chip mounting board to the radiator plate so as to easily obtain a desired thickness of an insulation resin layer between the chip mounting board and the radiator plate.

Another object of the present invention is to provide an electronic device in which a resin sealing semiconductor device having a structure in which a semiconductor chip is mounted to one surface of a chip mounting board (island), and at least part of the other surface of the chip mounting board is an exposed surface, and the semiconductor chip and the chip mounting board are resin-molded is mounted to a radiator plate, wherein a gap between the exposed surface of the chip mounting board and the radiator plate can be easily controlled and always maintained in a controlled size.

The present invention is applied to a resin sealing semiconductor device having a structure in which a portion to be sealed of components including at least one chip mounting board having a front surface that is a chip mounting surface and a back surface that is at least partly an exposed surface, a semiconductor chip mounted to the front surface of each chip mounting board, and a plurality of leads provided correspondingly to each chip mounting board and having inner lead portions connected to an electrode of the semiconductor chip on the corresponding chip mounting board via a connecting wire is embedded in a resin molded portion molded into a generally plate shape, and outer lead portions of the plurality of leads are led out in line from a side surface at one end in a width direction of the resin molded portion, and the exposed surface of each chip mounting board is placed on one surface of the resin molded portion.

In the present invention, a plurality of positioning protrusions are provided integrally with the resin molded portion on one surface of the resin molded portion, and a protrusion height of the positioning protrusions is set so that a gap to be filled with insulating resin is formed between each part of the exposed surface of each chip mounting board and a radiator plate when the positioning protrusions are abutted against the radiator plate.

As described above, the plurality of positioning protrusions are provided on one surface of the resin molded portion, and the protrusion height of the positioning protrusions is set so that the gap to be filled with insulating resin is formed between each part of the exposed surface of each chip mounting board and the radiator plate when the positioning protrusions are abutted against the radiator plate. Thus, when the semiconductor device is abutted against the radiator plate for connecting the radiator plate to the exposed surface of each chip mounting board, the positioning protrusions abut against the radiator plate to from a gap of a predetermined size between the exposed surface of the chip mounting board and the radiator plate, thereby allowing easy control of the gap between the chip mounting board and the radiator plate, and allowing each part of insulating resin to be filled in the gap therebetween to have a set thickness. Thus, the radiator plate can be easily mounted to the resin sealing semiconductor device without reducing a voltage-resistance property and a heat dissipation property.

In a preferred aspect of the present invention, a pair of semiconductor devices comprising blocks are provided, and the blocks are mechanically connected to comprise the resin sealing semiconductor device. Specifically, the resin sealing semiconductor device is divided into the two semiconductor device comprising blocks, and components that comprise the semiconductor device are placed in each block.

Each semiconductor device comprising block has a structure in which a portion to be sealed (a portion that needs to be sealed with resin) of components including at least one chip mounting board having a front surface that is a chip mounting surface and a back surface that is at least partly an exposed surface, a semiconductor chip mounted to the front surface of each chip mounting board, and a plurality of leads provided correspondingly to each chip mounting board and having inner lead portions connected to an electrode of a semiconductor chip on a corresponding chip mounting board via a connecting wire is embedded in a resin molded portion molded into a generally plate shape, and outer lead portions of the plurality of leads are led out in line from a side surface at one end in a width direction of the resin molded portion, and an exposed surface of each chip mounting board is placed on one surface of the resin molded portion.

The pair of semiconductor device comprising blocks are mechanically connected by a connecting portion with the side surfaces from which outer leads of the resin molded portions are drawn out facing each other, and the outer lead portions led out of the pair of blocks are drawn out through a gap formed between the pair of blocks.

Thus, when the resin sealing semiconductor device of a division type is comprised, the plurality of positioning protrusions are provided integrally with the resin molded portion on one surface of the resin molded portion of each block, and a protrusion height of the positioning protrusions is set so that a gap to be filled with insulating resin is formed between each part of an exposed surface of the chip mounting board of each block and a radiator plate when the positioning protrusions are abutted against the radiator plate.

In another preferred aspect of the present invention applied to a resin sealing semiconductor device of a division type, each semiconductor device comprising block has a structure in which a portion to be sealed of components including a plurality of chip mounting boards each having a front surface that is a chip mounting surface and a back surface that is at least partly an exposed surface and arranged in line on one plane, a semiconductor chip mounted to the front surface of each chip mounting board, and a plurality of leads provided correspondingly to each chip mounting board and having inner lead portions connected to an electrode of the semiconductor chip on the corresponding chip mounting board via a connecting wire is embedded in a resin molded portion molded into a generally horizontally oriented plate shape, and outer lead portions of the plurality of leads are led out in line in a longitudinal direction of the resin molded portion from a side surface at one end in a width direction of the resin molded portion, and an exposed surface of each chip mounting board is placed on one surface of the resin molded portion. Also in this case, the pair of semiconductor device comprising blocks are mechanically connected by a connecting portion with the side surfaces from which outer leads of the respective resin molded portions are drawn out facing each other, and the outer lead portions led out of the pair of blocks are drawn out through a gap formed between the pair of blocks.

In the resin sealing semiconductor device, there is a difference in thermal expansion coefficient between the resin molded portion and the components embedded in the resin molded portion, and particularly when the chip mounting board is exposed on one surface of the resin molded portion, there is a noticeable difference in thermal expansion coefficient between one surface and the other surface of the semiconductor device comprising block, which inevitably causes a nonnegligible warp in the semiconductor device comprising block. The warp of the block noticeably occurs in the semiconductor device comprising block of a horizontally oriented plate shape (a rectangular plate shape in a typical example) because the plurality of chip mounting boards are provided in parallel in the semiconductor device comprising block. When the warp occurs in the semiconductor device comprising block, the exposed surface of the chip mounting board is curved, which causes a problem in mounting the radiator plate to the exposed surface via an insulation resin layer.

Thus, in a preferred aspect of the present invention, it is predicted that a warp occurs in the semiconductor device comprising block, and even if the warp occurs, a predetermined gap can be formed between the exposed surface of each chip mounting board and the radiator plate.

For a predetermined gap to be formed between the exposed surface of each chip mounting board and the radiator plate even when a warp occurs in the semiconductor device comprising block, a direction of the warp of the semiconductor device comprising block needs to be constant. Thus, in the present invention, each block is comprised so that a warp with one surface of the resin molded portion of each block being a projecting surface occurs in each block under a temperature environment in mounting the exposed surface of the chip mounting board of each block to the radiator plate, by a difference in thermal expansion coefficient between one surface of the resin molded portion (a side on which the exposed surface of the chip mounting board is placed) and the other surface of the resin molded portion of each block. Also, positioning protrusions protruding from one surface of the resin molded portion of each block are provided integrally with the resin molded portion near opposite ends of two sides extending in a longitudinal direction of at least one surface of the resin molded portion of each block. Then, each positioning protrusion is provided to abut against the radiator plate with the warp of each block maintained, and a protrusion height of each positioning protrusion is set so that a gap to be filled with insulating resin is formed between each part of the exposed surface of the chip mounting board of each block and a radiator plate when the positioning protrusion is abutted against the radiator plate.

When the block has a warp with one surface of the resin molded portion being the projecting surface, it is particularly difficult to form a gap to be filled with insulating resin between each part of the exposed surface of the chip mounting board and the radiator plate in bonding the exposed surface of the chip mounting board to the radiator plate, and when the positioning protrusion is not provided, part of the exposed surface of the chip mounting board is brought into direct contact with the radiator plate, which may prevent insulation between the chip mounting board and the radiator plate.

On the other hand, in the present invention, in view of a warp of the block, the positioning protrusion is provided so as to form the gap between the exposed surface of the chip mounting board and the radiator plate at each part of the block even when the block has a warp, thereby preventing the exposed surface of the chip mounting board from being brought into direct contact with the radiator plate.

When the positioning protrusion is provided as described above that abuts against the radiator plate with the warp of each block maintained to form the gap to be filled with insulating resin between the exposed surface of each chip mounting board and the radiator plate in bonding the radiator plate to the exposed surface of the chip mounting board of each block, the gap formed between the exposed surface of the chip mounting board of each block and the radiator plate in a longitudinal direction of each block becomes the narrowest near a middle portion in the longitudinal direction of each block, and gradually becomes wider from the middle portion toward the opposite ends in the longitudinal direction of each block.

Thus, when each semiconductor device comprising block has a warp, the gap between the exposed surface of the chip mounting board of each block and the radiator plate is not uniform, but no problem occurs if the size of the narrowest portion of the gap formed between the exposed surface of the chip mounting board of each block and the radiator plate is set to the minimum necessary size for insulation between the chip mounting board and the radiator plate.

In the present invention, the warp that occurs in the semiconductor device comprising block is actively used to provide a good temperature balance of the resin sealing semiconductor device. Specifically, the warp that occurs in the semiconductor device comprising block is used to form the gap between the exposed surface of the chip mounting board and the radiator plate so that the gap becomes narrow near the middle portion in the longitudinal direction of each block, and gradually becomes wider from the middle portion toward the opposite ends in the longitudinal direction of each block, thereby obtaining an advantage described below.

Near the middle portion of the horizontally oriented block, heat generated from the semiconductor chip tends to be stored in the resin molded portion, and there are many other semiconductor chips adjacent to each semiconductor chip, and each semiconductor chip is heated by heat from the adjacent other semiconductor chips, which tends to locally increase a temperature of the block. If the temperature of the block is locally increased, thermal runaway may occur in the semiconductor chip therein to cause breakage of the semiconductor chip. To prevent such a circumstance, it is necessary to provide a good temperature balance of each part in the semiconductor device comprising block to prevent a local temperature increase.

As in the present invention, when the positioning protrusion is provided so as to abut against the radiator plate with the warp of each block maintained to form the gap to be filled with insulating resin between the exposed surface of each chip mounting board and the radiator plate in bonding the radiator plate to the exposed surface of the chip mounting board of each block, the gap between the exposed surface of the chip mounting board and the radiator plate becomes narrow near the middle portion in the longitudinal direction of each block, and gradually becomes wider toward the opposite ends in the longitudinal direction of each block. Comprises as described, a thickness of an adhesive layer can be reduced near the middle portion in the longitudinal direction of the block to allow good temperature transfer from the chip mounting board to the radiator plate, thereby preventing a local temperature increase near the middle portion of the block.

Near the opposite ends in the longitudinal direction of each block, the gap between the exposed surface of the chip mounting board and the radiator plate becomes wider (the insulation resin layer becomes thicker) to prevent temperature transfer from the chip mounting board to the radiator plate, but near the opposite ends of the block, heat is not stored in the resin molded portion, and also there are a small number of other semiconductor chips adjacent to each semiconductor chip therein, and thus no problem occurs even if the gap between the exposed surface of the chip mounting board and the radiator plate is wide to some extent.

Thus, the gap formed between the exposed surface of the chip mounting board of each semiconductor device comprising block and the radiator plate becomes the narrowest near the middle portion in the longitudinal direction of each block, and gradually becomes wider from the middle portion toward the opposite ends in the longitudinal direction of each block. This provides good heat transfer to the radiator plate near the middle portion in the longitudinal direction of the block where the temperature of the semiconductor chip therein tends to increase, and prevents the heat transfer from the block to the radiator plate near the opposite ends of the block where the temperature of the semiconductor chip therein gently increases, thereby allowing a good temperature balance of the entire block, and preventing a local temperature increase therein to cause thermal runaway of the element therein.

An amount of warp of the block changes with ambient temperature. When the amount of warp of the block changes, a proper value of a protrusion size of the positioning protrusion also changes. Thus, in implementing the present invention, the amount of warp of the block needs to be predictable in determining the proper value of the protrusion size of the positioning protrusion. Generally, if the ambient temperature is constant, the amount of warp of the semiconductor device comprising block is constant, and thus the temperature in mounting the semiconductor device to the radiator plate is controlled to be maintained constant (the semiconductor device is bonded to the radiator plate in a room where temperature is controlled to be constant), thereby allowing an always constant proper value of the protrusion size of each positioning protrusion, and preventing a reduction in mass productivity of the semiconductor device.

In a preferred aspect of the present invention, a pair of semiconductor device comprising blocks are provided in which a portion to be sealed of components including three chip mounting boards each having a front surface that is a chip mounting surface and a back surface that is at least partly an exposed surface and arranged in line on one plane, a three-phase semiconductor chip mounted to the front surfaces of the three chip mounting boards, and a plurality of leads provided correspondingly to each chip mounting board and having inner lead portions connected to an electrode of the semiconductor chip on the corresponding chip mounting board via a connecting wire is embedded in a resin molded portion molded into a horizontally oriented plate shape, and outer lead portions of the plurality of leads are led out in line in a longitudinal direction of the resin molded portion from a side surface at one end in a width direction of the resin molded portion, and an exposed surface of each chip mounting board is placed on one surface of the resin molded portion, and the pair of blocks are mechanically connected by a connecting portion with the side surfaces from which outer leads of the resin molded portions are drawn out facing each other to comprise a resin sealing semiconductor device. The outer lead portions led out of the pair of blocks are drawn out through a gap formed between the pair of blocks, and the pair of blocks are connected so that the three-phase semiconductor chip provided in each of the pair of blocks comprises a three-phase bridge circuit such as a three-phase rectifier circuit or an inverter circuit.

Also in the present invention, each block is comprised so that a warp with one surface of the resin molded portion of each block being a projecting surface occurs in each block under a temperature environment in mounting the exposed surface of the chip mounting board of each block to the radiator plate, by a difference in thermal expansion coefficient between one surface of the resin molded portion of each block and the other surface of the resin molded portion of each block. Also, a positioning protrusion protruding from one surface of the resin molded portion of each block is provided integrally with the resin molded portion near opposite ends of two sides extending in a longitudinal direction of at least one surface of the resin molded portion of each block. Then, each positioning protrusion is provided to abut against the radiator plate with the warp of each block maintained, and a protrusion height of each positioning protrusion is set so that a gap to be filled with insulating resin is formed between each part of an exposed surface of the chip mounting board of each block and a radiator plate when the positioning protrusion is abutted against the radiator plate.

As described above, when the chip mounting boards mounted with the three-phase semiconductor chip are laterally arranged in line, the semiconductor chip in the middle phase is heated by heat generated from the semiconductor chips in the both side phases, and thus the temperature of the semiconductor chip in the middle phase tends to increase, and the temperature near the middle portion in the longitudinal direction of the block tends to increase. The present invention can provide good heat transfer from the chip mounting board to the radiator plate in the middle portion in the longitudinal direction of the block to prevent a temperature increase of the semiconductor chip in the middle phase, thereby preventing a local temperature increase near the middle portion in the longitudinal direction of the block, and allowing substantially uniform temperature distribution in each part of the block.

In a further preferred aspect of the present invention, a pair of semiconductor device comprising blocks are provided in which a portion to be sealed of components including a plurality of chip mounting boards each having a front surface that is a chip mounting surface and a back surface that is at least partly an exposed surface for heat dissipation and arranged in line on one plane, a semiconductor chip mounted to the front surface of each chip mounting board, and a plurality of leads provided correspondingly to each chip mounting board and having inner lead portions connected to an electrode of the semiconductor chip on the corresponding chip mounting board via a connecting wire is embedded in a resin molded portion molded into a horizontally oriented plate shape, and outer lead portions of the plurality of leads are led out in line in a longitudinal direction of the resin molded portion from a side surface at one end in a width direction of the resin molded portion, and an exposed surface of each chip mounting board is placed on one surface of the resin molded portion, and the pair of blocks are mechanically connected by a connecting portion with the side surfaces from which outer leads of the resin molded portions are drawn out facing each other to comprise a resin sealing semiconductor device. The outer lead portions led out of the pair of blocks are drawn out through a gap formed between the pair of blocks.

In the present invention, a pair of rib-shaped positioning protrusions extending in parallel in the longitudinal direction of the resin molded portion are provided at opposite ends in the width direction of one surface of the resin molded portion of each block, and a height of the positioning protrusions is set so that a gap to be filled with insulating resin is formed between the exposed surface of each chip mounting board and the radiator plate when the positioning protrusions are abutted against the radiator plate.

As described above, the rib-shaped positioning protrusion increases rigidity of the resin molded portion to prevent a warp of each block, thereby allowing the gap between the exposed surface of the chip mounting board and the radiator plate to be substantially uniform. Thus, the present invention is useful when a thickness of an insulation layer provided between the chip mounting board and the radiator plate is to be substantially uniform.

The present invention is also applied to an electronic device comprising: a resin sealing semiconductor device; and a radiator plate that is connected to an exposed surface of a chip mounting board provided in the semiconductor device in a heat transfer manner (so that heat is transferred therebetween) to facilitate heat dissipation from the semiconductor device.

The resin sealing semiconductor device used in the electronic device to which the present invention is applied has a structure in which a portion to be sealed of components including at least one chip mounting board having a front surface that is a chip mounting surface and a back surface that is at least partly an exposed surface for mounting a radiator plate, a semiconductor chip mounted to the front surface of each chip mounting board, and a plurality of leads provided correspondingly to each chip mounting board and having inner lead portions connected to an electrode of the semiconductor chip on the corresponding chip mounting board via a connecting wire is embedded in a resin molded portion molded into a generally plate shape, and outer lead portions of the plurality of leads are led out in line from a side surface at one end in a width direction of the resin molded portion, and an exposed surface of each chip mounting board is placed on one surface of the resin molded portion, and the exposed surface of each chip mounting board is connected to the radiator plate in a heat transfer manner.

In the electronic device according to the present invention, a plurality of positioning protrusions are provided on one surface of the resin molded portion of the resin sealing semiconductor device, and the positioning protrusions are abutted against the radiator plate to form a gap between the exposed surface of each chip mounting board and the radiator plate, and the gap between the exposed surface of each chip mounting board and the radiator plate is filled with insulating and bonding resin to bond the exposed surface of each chip mounting board to the radiator plate.

In a preferred aspect of the electronic device according to the present invention, a resin sealing semiconductor device of a division type is used having a structure in which the device is divided into two semiconductor device comprising blocks, and the blocks are mechanically connected. Each semiconductor device comprising block of the resin sealing semiconductor device used in this aspect has a structure in which a portion to be sealed of components including at least one chip mounting board having a front surface that is a chip mounting surface and a back surface that is at least partly an exposed surface for mounting a radiator plate, a semiconductor chip mounted to the front surface of each chip mounting board, and a plurality of leads provided correspondingly to each chip mounting board and having inner lead portions connected to an electrode of the semiconductor chip on the corresponding chip mounting board via a connecting wire is embedded in a resin molded portion molded into a generally plate shape, and outer lead portions of the plurality of leads are led out in line from a side surface at one end in a width direction of the resin molded portion, and an exposed surface of each chip mounting board is placed on one surface of the resin molded portion. The pair of semiconductor device comprising blocks are mechanically connected by a connecting portion with the side surfaces from which outer leads of the resin molded portions are drawn out facing each other, and the outer lead portions led out of the pair of blocks are drawn out through a gap formed between the resin molded portions of the pair of blocks.

In the present invention, a plurality of positioning protrusions are provided on one surface of the resin molded portion of each block of the resin sealing semiconductor device comprised as described above, and the positioning protrusions are abutted against the radiator plate to form a gap between the exposed surface of the chip mounting board of each block and the radiator plate, and the gap between the exposed surface of the chip mounting board of each block and the radiator plate is filled with insulating and bonding resin to bond the exposed surface of the chip mounting board of each block to the radiator plate.

In another preferred aspect of the electronic device according to the present invention, each semiconductor device comprising block that comprises the resin sealing semiconductor device has a structure in which a portion to be sealed of components including a plurality of chip mounting boards having a front surface that is a chip mounting surface and a back surface that is at least partly an exposed surface for heat dissipation and arranged in line on one plane, a semiconductor chip mounted to the front surface of each chip mounting board, and a plurality of leads provided correspondingly to each chip mounting board and having inner lead portions connected to an electrode of the semiconductor chip on the corresponding chip mounting board via a connecting wire is embedded in a resin molded portion molded into a generally horizontally oriented plate shape, and outer lead portions of the plurality of leads are led out in line in a longitudinal direction of the resin molded portion from a side surface at one end in a width direction of the resin molded portion, and an exposed surface of each chip mounting board is placed on one surface of the resin molded portion. Also in this case, the pair of blocks are mechanically connected by a connecting portion with the side surfaces from which outer leads of the resin molded portions are drawn out facing each other, and the outer lead portions led out of the pair of blocks are drawn out through a gap formed between the pair of blocks.

Also in this case, each block is comprised so that a warp with one surface of the resin molded portion of each block being a projecting surface occurs in each block under a temperature environment in bonding the exposed surface of the chip mounting board of each block to the radiator plate, by a difference in thermal expansion coefficient between one surface of the resin molded portion of each block and the other surface of the resin molded portion of each block. Also, positioning protrusions that abut against the radiator plate are provided near opposite ends of two sides extending in a longitudinal direction of at least one surface of the resin molded portion of each block, and a protrusion height of each positioning protrusion is set so that a gap is formed between each part of the exposed surface of the chip mounting board of each block and the radiator plate. The gap formed between each part of the exposed surface of the chip mounting board of each block of the resin sealing semiconductor device and the radiator plate is filled with insulating and bonding resin to bond the exposed surface of the chip mounting board of each block to the radiator plate.

In a further preferred aspect of the electronic device according to the present invention, each semiconductor device comprising block that comprises the resin sealing semiconductor device has a structure in which a portion to be sealed of components including three chip mounting boards each having a front surface that is a chip mounting surface and a back surface that is at least partly an exposed surface for heat dissipation and arranged in line on one plane, a three-phase semiconductor chip mounted to the front surfaces of the three chip mounting boards, and a plurality of leads provided correspondingly to each chip mounting board and having inner lead portions connected to an electrode of the semiconductor chip on the corresponding chip mounting board via a connecting wire is embedded in a resin molded portion molded into a substantially rectangular plate shape long in an arranging direction of the three chip mounting boards, and outer lead portions of the plurality of leads are led out in line in a longitudinal direction of the resin molded portion from a side surface at one end in a width direction of the resin molded portion, and an exposed surface of each chip mounting board is placed on one surface of the resin molded portion. Also in this case, the pair of blocks are mechanically connected by a connecting portion with the side surfaces from which outer leads of the resin molded portions are drawn out facing each other, and the outer lead portions led out of the pair of blocks are drawn out through a gap formed between the pair of blocks. In this example, the three-phase semiconductor chips in the pair of blocks are connected to comprise a three-phase bridge circuit for use.

Also in the present invention, each block is comprised so that a warp with one surface of the resin molded portion of each block being a projecting surface occurs in each block under a temperature environment in mounting the exposed surface of the chip mounting board of each block to the radiator plate, by a difference in thermal expansion coefficient between one surface of the resin molded portion of each block and the other surface of the resin molded portion of each block of the resin sealing semiconductor device.

Also, positioning protrusions that abut against the radiator plate are provided near opposite ends of two sides extending in a longitudinal direction of at least one surface of the resin molded portion of each block, and a height of each positioning protrusion is set so that a gap is formed between each part of the exposed surface of the chip mounting board of each block and the radiator plate. The gap formed between each part of the exposed surface of the chip mounting board of each block of the resin sealing semiconductor device and the radiator plate is filled with insulating and bonding resin to bond the exposed surface of the chip mounting board of each block to the radiator plate.

In a further preferred aspect of the electronic device according to the present invention, positioning protrusions that abut against the radiator plate are provided near opposite ends of two sides extending in a longitudinal direction of at least one surface of the resin molded portion of each block, and a height of each positioning protrusion is set so that a gap is formed between each part of an exposed surface of the chip mounting board of each block and the radiator plate. Also, a series of outer leads of the resin sealing semiconductor device are led out on a side opposite from the radiator plate, and soldered to a circuit board placed on two blocks of the resin sealing semiconductor device. Then, the circuit board is fastened to the radiator plate by a screw, and thus the resin sealing semiconductor device is secured to the radiator plate while being pressed by the circuit board. In this case, an insulation sheet, instead of an adhesive, is inserted into the gap between the exposed surface of the chip mounting board of each block of the resin sealing semiconductor device and the radiator plate, and the insulation sheet insulates between the exposed surface of the chip mounting board of each block of the resin sealing semiconductor device and the radiator plate.

In a further preferred aspect of the electronic device according to the present invention, two presser plates are placed on surfaces on a side opposite from the radiator plate of two blocks of the resin sealing semiconductor device, and the two presser plates are fastened to the radiator plate by screws, and thus the two blocks of the resin sealing semiconductor device are secured to the radiator plate while being pressed against the radiator plate. Also in this case, an insulation sheet, instead of an adhesive, is inserted into the gap between the exposed surface of the chip mounting board of each block of the resin sealing semiconductor device and the radiator plate, and the insulation sheet insulates between the exposed surface of the chip mounting board of each block of the resin sealing semiconductor device and the radiator plate.

In a further preferred aspect of the electronic device according to the present invention, the radiator plate has a recessed surface curving at substantially the same curvature as a facing projecting surface in a region facing one surface that forms the projecting surface, of the resin molded portion of each block of the resin sealing semiconductor device, a gap having a substantially uniform size over the entire exposed surface of the chip mounting board of each block is formed between the exposed surface of the chip mounting board of each block of the resin sealing semiconductor device and the recessed surface provided in the radiator plate, and insulating and bonding resin filled in the gap bonds the exposed surface of the chip mounting board of each block to the radiator plate.

As described above, according to the present invention, the positioning protrusion that abuts against the radiator plate to form the gap to be filled with insulating resin between the exposed surface of each chip mounting board and the radiator plate in mounting the radiator plate to the exposed surface of each chip mounting board is provided on one surface of the resin molded portion integrally with the resin molded portion. Thus, when the semiconductor device is abutted against the radiator plate for mounting the radiator plate to the exposed surface of each chip mounting board, the positioning protrusion can abut against the radiator plate to form a gap of a predetermined size between the exposed surface of the chip mounting board and the radiator plate. This allows the gap between the chip mounting board and the radiator plate to be easily controlled, and allows each part of resin filled in the gap therebetween to have a set size. Thus, the radiator plate can be easily mounted to the resin sealing semiconductor device without reducing a voltage-resistance property or a heat dissipation property.

In the present invention, when the pair of semiconductor device comprising blocks are connected to comprise the resin sealing semiconductor device, the warp that inevitably occurs in each semiconductor device comprising block is used so that the gap formed between the exposed surface of the chip mounting board of each semiconductor device comprising block and the radiator plate becomes the narrowest near the middle portion in the longitudinal direction of each block, and gradually becomes wider from the middle portion toward the opposite ends in the longitudinal direction of each block. This provides a good heat transfer to the radiator plate near the middle portion in the longitudinal direction of the block where the temperature of the semiconductor chip therein tends to increase, and prevents the heat transfer from the block to the radiator plate near the opposite ends of the block where the temperature of the semiconductor chip therein gently increases, thereby allowing a good temperature balance of the entire block, thus preventing a local temperature increase in the block to cause thermal runaway of the element therein, and increasing reliability of the resin sealing semiconductor device.

DETAILED DESCRIPTION OF THE PREFERRED EMBODIMENTS

Now, preferred embodiments of the present invention will be described in detail with reference to the drawings.

The present invention is suitably applied to a semiconductor device that comprises a power circuit through which a large current flows, and in an embodiment, a resin sealing semiconductor device is taken, as an example, that is used for comprising a short-circuit type voltage regulator that controls to maintain, within a set range, a voltage supplied from a three-phase magnet type AC generator driven by a prime motor such as an engine to a DC load.

Figure 1:
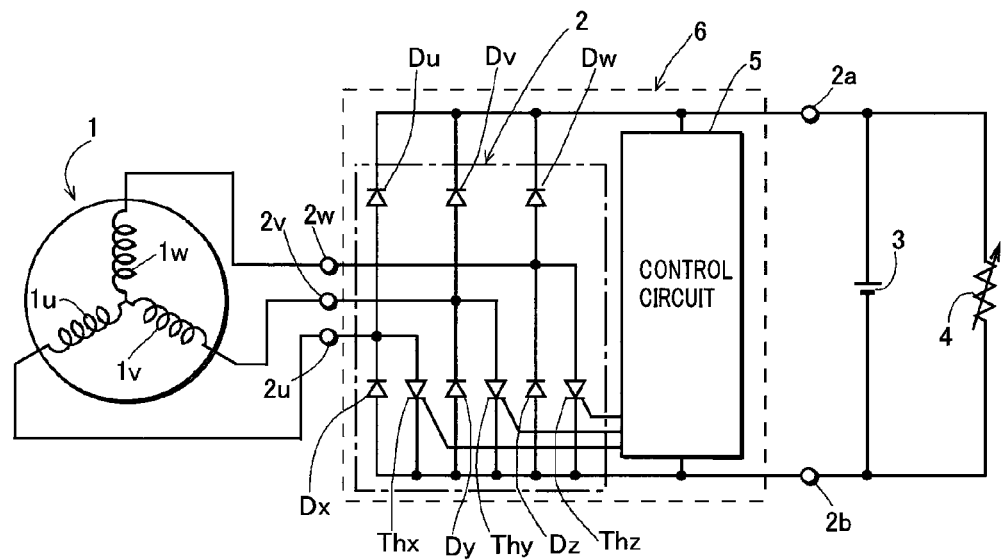
FIG. 1 is a circuit diagram of an example of a circuit construction of a resin sealing semiconductor device according to an embodiment of the present invention.

In FIG. 1, a reference numeral 1 denotes a three-phase magnet type AC generator driven by a prime motor, which is comprised of a magneto rotor (not shown) mounted to a rotating shaft of the prime motor, and a stator including three-phase armature coils 1$u$ to 1$w$. A reference numeral 6 denotes a short-circuit type voltage regulating circuit comprised of a resin sealing semiconductor device to which the present invention is applied.

The shown short-circuit type voltage regulating circuit is comprised of a diode bridge three-phase full-wave rectifier circuit constituted by first to third diodes Du, Dv and Dw and fourth to sixth diodes Dx to Dz having anodes commonly connected and cathodes connected to anodes of the diodes Du to Dw, and a first to third thyristors Thx to Thz for a generator output short circuit connected in anti-parallel with opposite ends of the fourth to sixth diodes Dx to Dz that form a lower side of a bridge of the rectifier circuit.

From a common connection point of cathodes of the first to third diodes Du to Dw and a common connection point of the anodes of the fourth to sixth diodes Dx to Dz, a positive output terminal 2$a$ and a negative output terminal 2$b$, respectively, of the semiconductor device are drawn out. A battery 3 and a load 4 are connected across the output terminals. Connection points between the anodes of the first to third diodes Du to Dw and the cathodes of the fourth to sixth diodes Dx to Dz are three-phase AC input terminals 2$u$, 2$v$ and 2$w$, and the three-phase output terminals of the generator are connected to the input terminal 2$u$, 2$v$ and 2$w$.

A reference numeral 5 denotes a control circuit comprised of a hybrid IC, which detects a voltage across the output terminals 2$a$ and 2$b$, simultaneously provides trigger signals to the first to third thyristors Thx to Thz when the detected voltage exceeds a set value, and stops providing the trigger signals to the thyristors Thx to Thz when the voltage across the output terminals 2$a$ and 2$b$ becomes lower than the set value. The short-circuit type voltage regulator 6 having a rectifying function is comprised of the semiconductor device 2 and the control circuit 5.

In the voltage regulator in FIG. 1, when the voltage across the output terminals 2$a$ and 2$b$ is lower than the set value, the thyristors Thx to Thz are off, and a rectifying output of the generator 1 is applied to the battery 3 and the load 4. When the voltage across the output terminals 2$a$ and 2$b$ exceeds the set value, the control circuit 5 provides the trigger signals to the thyristors Thx to Thz, and among the thyristors, a thyristor in which a forward voltage is applied across an anode and a cathode is turned on, and an output of the generator 1 is short-circuited through a short circuit constituted by either the thyristor in the on state or the diodes Dx to Dz that form the lower side of the bridge of the rectifier circuit. This reduces the output voltage of the generator lower than the set value. When the reduction in the output voltage of the generator reduces the voltage across the output terminals 2$a$ and 2$b$ lower than the set value, no trigger signal is provided to the thyristors Thx to Thz, and each thyristor is turned off when an anode current thereof becomes a holding current or lower. This increases the output voltage of the generator. These operations are repeated to maintain the voltage across the output terminals 2$a$ and 2$b$ around the set value.

In the voltage regulating circuit in FIG. 1, the current flows through the diodes Du to Dw that form an upper side of the bridge only in a positive half cycle of each phase current in a non-short-circuit state of the output, while the current flows through the diodes Dx to Dz that form the lower side of the bridge in a negative half cycle of each phase current both in the non-short-circuit state and a short-circuit state of the output. Thus, an amount of heat generated from the diodes Dx, Dy and Dz that form the lower side of the bridge is larger than an amount of heat generated from the diodes Du, Dv and Dw that form the upper side of the bridge.

Figure 2:
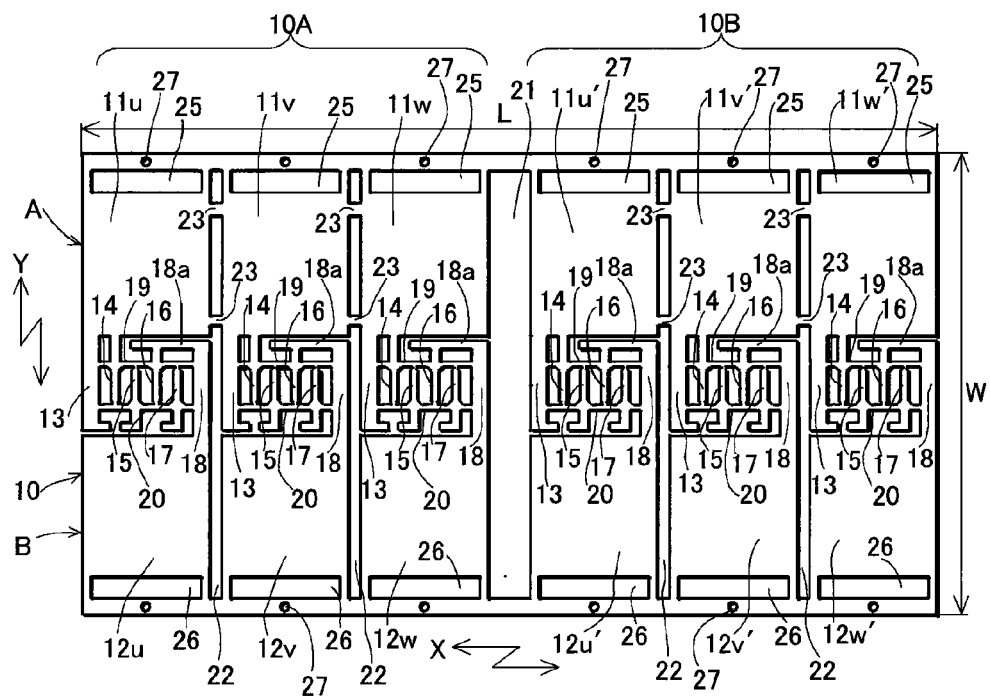
FIG. 2 is a plan view of a construction of a lead frame used in the embodiment of the present invention.

FIG. 2 shows a preferred exemplary construction of a lead frame 10 used for comprising the semiconductor device 2 in FIG. 1. The lead frame is formed into a generally rectangular shape by stamping a relatively thick plate made of a conductive material such as copper having high conductivity, and has predetermined sizes W and L in a width direction (Y direction) and a longitudinal direction (X direction), respectively.

The shown lead frame 10 includes chip mounting boards (islands) and leads for two semiconductor devices. In a first half part 10A representing a left half part of the shown lead frame, first to third chip mounting boards 11$u$ to 11$w$ in a first group A, first to third chip mounting boards 12$u$ to 12$w$ in a second group B, and a lead group including leads 13 to 18 provided on the chip mounting boards are provided on one plane, which are used for comprising one semiconductor device.

In a second half part 10B representing a right half part of the shown lead frame, first to third chip mounting boards 11$u'$ to 11$w'$ in the first group A, first to third chip mounting boards 12$u'$ to 12$w'$ in the second group B, and a lead group including leads 13 to 18 provided on the chip mounting boards are provided on one plane, which are used for comprising the other semiconductor device.

Each chip mounting board has a front surface that is a chip mounting surface and a back surface that is an exposed surface for mounting a radiator plate. When a resin molded portion described later is formed, the exposed surface of each chip mounting board is not covered with the molded portion but is exposed to the outside. In the shown example, each chip mounting board is formed into a rectangular shape, and the chip mounting boards 11u to 11w and 11u' to 11w' in the first group A are paired with the chip mounting boards 12u to 12w and 12u' to 12w' in the second group B. In this example, a semiconductor chip for electric power that generates heat is mounted on the front surface (chip mounting surface) of each chip mounting board, and each chip mounting board is formed to be relatively thick so as to have a function as a heat sink.

The first to third chip mounting boards 11u to 11w in the first group A provided in the first half part 10A of the lead frame and the first to third chip mounting boards 11u' to 11w' provided in the second half part 10B are provided at one end in the width direction of the lead frame 10, and arranged in line in the longitudinal direction of the lead frame.

The first to third chip mounting boards 12u to 12w in the second group B provided in the first half part 10A of the lead frame 10 and the first to third chip mounting boards 12u' to 12w' in the second group B provided in the second half part 10B are provided at the other end in the width direction of the lead frame, and arranged in line in the longitudinal direction of the lead frame similarly to the chip mounting boards in the first group.

The pairs of chip mounting boards (11u and 12u), (11v and 12v) and (11w and 12w) are placed to face each other with spaces therebetween in the width direction of the lead frame, and the plurality of leads 13 to 18 provided correspondingly to each pair of chip mounting boards are placed in the space between each pair of chip mounting boards formed in a middle portion in the width direction of the frame. Each lead is formed to be thinner than the chip mounting board.

Among the leads 13 to 18 placed between each pair of chip mounting boards (for example, 11u and 12u), the leads 13 and 14 are provided with rear ends connected to the chip mounting board 11u in the first group A, and the lead 18 is provided with a rear end connected to the chip mounting board 12u in the second group B.

The leads 13, 14 and 18 extend in the width direction of the lead frame 10, a tip of the lead 13 terminates in a position close to the chip mounting board 12u in the second group B, and a tip of the lead 14 terminates in a position before the tip of the lead 13. A tip of the lead 18 extends to a position close to the chip mounting board 11u in the first group A, and a rear end of the lead 16 extending toward the chip mounting board in the second group in the width direction of the frame is connected to a cross lead 18a bending from the tip of the lead 18 toward the lead 14 and extending perpendicular to a facing direction of the pair of chip mounting boards.

The lead 16 is placed substantially in an intermediate portion between the lead 14 and the lead 18, and a tip thereof terminates in a position apart from the chip mounting board 12u in the second group B. Between the lead 14 and lead 16 and between the lead 16 and the lead 18, the leads 15 and 17 extending in the width direction of the lead frame are placed.

Rear ends of the leads 15 and 17 are placed in positions close to the chip mounting board 12u in the second group B among the pair of chip mounting boards, and tips thereof terminate in positions apart from the chip mounting board 11u in the first group A. The series of leads 13 to 18 placed between the pair of chip mounting boards are connected by separatable connecting leads 19 and 20 extending in the longitudinal direction of the frame.

To partition between the first half part 10A and the second half part 10B of the of the lead frame 10, a relatively wide slit 21 extending in the width direction of the frame is formed between the first half part 10A and the second half part 10B. In this example, one unit lead frame is comprised of each pair of chip mounting boards and the leads 13 to 18 placed therebetween, and a total of three unit lead frames are comprised in each of the first and second half parts 10A and 10B of the lead frame.

A narrow slit 22 extending in the width direction of the frame is formed so as to partition between the three unit lead frames comprised in each of the half parts 10A and 10B of the lead frame 10, and connecting portions 23 for electrically connecting between the chip mounting boards 11u to 11w in the first group are provided so as to divide the slit 22.

Rectangular slits 25 and 26 extending in the longitudinal direction of the frame are formed between each chip mounting board in the first group A and one end in the width direction of the frame, and between each chip mounting board in the second group B and the other end in the width direction of the frame, and positioning holes 27 in which positioning pins are fitted in positioning the lead frame to a jig are formed in strip portions left at one end and the other end in the width direction of the lead frame.

As described above, in the embodiment, the lead frame 10 includes the first to third chip mounting boards 11u to 11w in the first group arranged in line in the longitudinal direction of the lead frame at one end in the width direction, and the first to third chip mounting boards 12u to 12w in the second group provided at the other end in the width direction of the lead frame so as to be paired with the first to third chip mounting boards 11u to 11w in the first group, the pairs of chip mounting boards in the first group and the second group are placed to face each other with spaces therebetween in the width direction of the lead frame, and the plurality of leads 13 to 18 corresponding to each pair of chip mounting boards are placed in the space formed between each pair of chip mounting boards in the first group and the second group.

Figure 3:
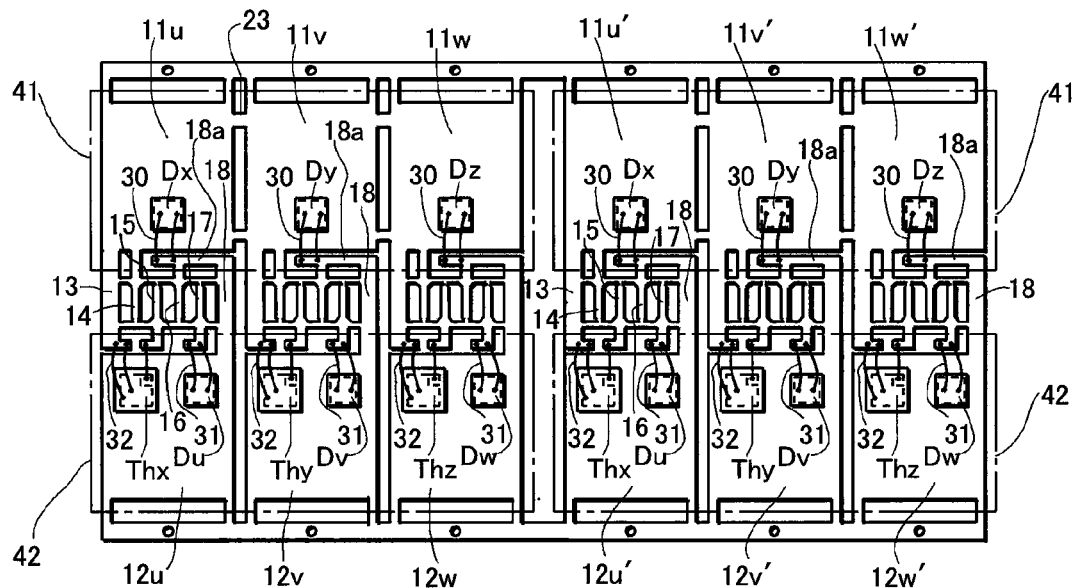
FIG. 3 is a plan view of a state where a semiconductor chip is mounted to the lead frame shown in FIG. 2, and the semiconductor chip and the lead are connected by a connecting wire.

FIG. 3 shows a state where semiconductor chips that comprise the semiconductor device 2 in FIG. 1 are mounted to the lead frame 10 for wiring. In the semiconductor device according to the present invention, the plurality of semiconductor chips are divided into semiconductor chips in the first group and semiconductor chips in the second group, and the semiconductor chips in both the groups are mounted to one end and the other end in the width direction of the lead frame with spaces therebetween in the width direction of the lead frame.

As a resin sealing portion, a first resin molded portion 41 covering a portion to be sealed of components (portion except the exposed surface of the chip mounting board and outer lead portions of the leads) including the chip mounting boards, the leads, the semiconductor chips and the connecting wires in the first group, and a second resin molded portion 42 covering a portion to be sealed of components including the chip mounting boards, the leads, the semiconductor chips and the connecting wires in the second group are provided. The resin molded portions 41 and 42 are molded into a horizontally oriented plate shape long in an arranging direction of the chip mounting boards 11u to 11w and the 12u to 12w (rectangular plate shape in the shown example), and the outer lead portions of the series of leads are led out in line in the longitudinal direction of the resin molded portion from a side surface at one end in the width direction of each of the resin molded portions 41 and 42.

A first semiconductor device comprising block BL1 is comprised of the first resin molded portion 41 and the components embedded therein, and a second semiconductor device comprising block BL2 is comprised of the second resin molded portion 42 and components embedded therein. The blocks BL1 and BL2 are placed with the side surfaces from which the leads of the resin molded portions are led out facing each other, and the resin molded portions of the blocks are mechanically connected by the connecting portion. A gap is formed between the first block BL1 and the second block BL2, and outer lead portions of the plurality of leads connected to a circuit in the first block BL1 and outer lead portions of the plurality of leads connected to a circuit in the second block BL2 are drawn out, as lead terminals, through the gap between the first block BL1 and the second block BL2.

More specifically, in the embodiment, to comprise the short-circuit type voltage regulating circuit in FIG. 1, the first to third diodes Du to Dw, the fourth to sixth diodes Dx to Dz having the anodes commonly connected and the cathodes connected to the anodes of the first to third diodes Du to Dw and that constitute the diode bridge three-phase full-wave rectifier circuit together with the first to third diodes Du to Dw, and the first to third thyristors Thx to Thz connected in anti-parallel with the fourth to sixth diodes Dx to Dz and simultaneously triggered in short-circuiting between input terminals of the rectifier circuit (output terminals of the generator 1) for regulating an output voltage of the rectifier circuit are provided, and chips that comprise the semiconductor chips are mounted to the lead frame 10. In the embodiment, chips of the fourth to sixth diodes Dx to Dz are the semiconductor chips in the first group, and chips of the first to third diodes Du to Dw and chips of the thyristors Thx to Thz are the semiconductor chips in the second group. The cathodes of the first to third diodes Du to Dw are commonly connected via a wiring pattern provided on a circuit board and connected to a positive output terminal when the semiconductor device of the embodiment is mounted to the circuit board.

In the example in FIG. 3, the chips of the diodes Dx to Dz that form the lower side of the bride are mounted to the chip mounting boards 11u to 11w in the first group of the lead frame 10. The diodes each having an anode and a cathode on one surface and the other surface of the chip are used, and the anodes are directly soldered to the chip mounting boards 11u to 11w. Similarly, the diodes Dx to Dz are mounted to the chip mounting boards 11u' to 11w'.

The chips of the thyristors Thx to Thz and the chips of the diodes Du to Dw are mounted to the chip mounting boards 12u to 12w in the second group. The chips of the thyristors Thx to Thz each have an anode on one surface and a cathode and a gate on the other surface, and the anodes are soldered to the chip mounting boards 12u to 12w. The anodes of the diodes Du to Dw are directly soldered to the chip mounting boards 12u to 12w. Similarly, the chips of the diodes Du to Dw and the chips of the thyristors Thx to Thz are mounted to the chip mounting boards 12u' to 12w' in the second group.

Then, the cathodes of the diodes Dx to Dz mounted to the chip mounting boards in the first group are connected to corresponding cross leads 18a via a plurality of (two in the shown example) connecting wires (wires with high conductivity) 30, and the cathodes of the diodes Du to Dw are connected to rear ends of corresponding leads 17 via a plurality of connecting wires 31. The cathodes of the thyristors Thx to Thz are connected to tips of corresponding leads 13 via a plurality of connecting wires 32, and the gates of the thyristors Thx to Thz are connected to rear ends of corresponding leads 15 via connecting wires. Each semiconductor chip is placed close to the lead so that the length of the connecting wire can be short when a terminal of each semiconductor chip and a predetermined lead are connected via a connecting wire. The short connecting wire connecting between each semiconductor chip and the lead can reduce heat generated from the connecting wire, and also prevent the connecting wire from moving to cause a break in the wire in molding a resin molded portion.

After wiring between the semiconductor chips mounted to all the chip mounting boards and the predetermined leads, a portion except the exposed surfaces of the first to third chip mounting boards 11u to 11w in the first group A, inner lead portions (portions near roots of the leads) of the leads 13, 16 and 18 electrically connected to the semiconductor chips mounted to the first to third chip mounting boards, the semiconductor chips mounted to the chip mounting boards 11u to 11w in the first group A, and the connecting wires 30 connecting the semiconductor chips to the leads 18 are covered with resin to comprise the first resin molded portion 41 having a flat horizontally oriented plate shape, and the first resin molded portion 41 and components embedded therein comprise the first semiconductor device comprising block BL1.

A portion except the exposed surfaces of the first to third chip mounting boards 12u to 12w in the second group B, inner lead portions of the leads 13, 15 and 17 electrically connected to the semiconductor chips mounted to the first to third chip mounting boards, the semiconductor chips mounted to the first to third chip mounting boards 12u to 12w in the second group B, and the connecting wires connecting the semiconductor chips to the leads are covered with resin to comprise the second resin molded portion 42 having a flat horizontally oriented plate shape, and the second resin molded portion 42 and components embedded therein comprise the second semiconductor device comprising block BL2. The first and second resin molded portions 41 and 42 are formed by transfer molding.

Figure 4:
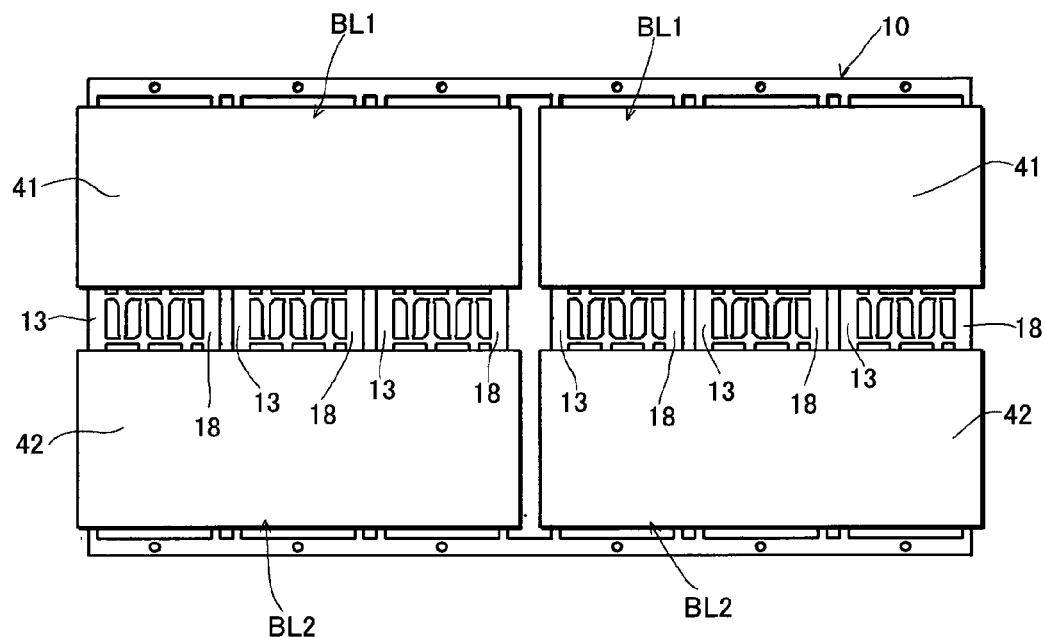
FIG. 4 is a plan view of a workpiece obtained by forming a resin molded portion on the lead frame to which the semiconductor chip is mounted as shown in FIG. 3.

FIG. 4 shows a state where the first resin molded portion 41 and the second resin molded portion 42 are thus formed to comprise the first and second semiconductor device comprising blocks BL1 and BL2. A gap is formed between the first block BL1 and the second block BL2. In this example, the plurality of leads 13 and 18 that form part of the lead frame are connecting portions mechanically connecting between the first resin molded portion 41 and the second resin molded portion 42, and opposite ends of each lead that comprises the connecting portion are embedded in the first resin molded portion 41 and the second resin molded portion 42.

Figure 5:
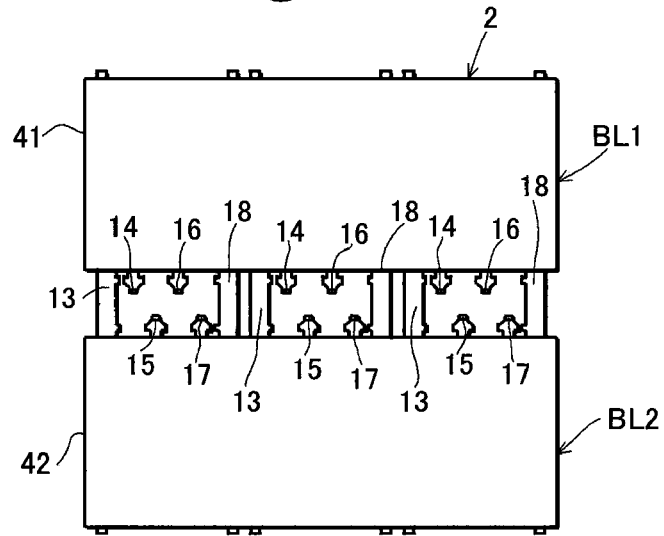
FIG. 5 is a plan view of a finished product obtained by separating an outer frame portion of the lead frame from the workpiece in FIG. 4 to mold an outer lead portion of a lead.

As described above, after the first and second semiconductor device comprising blocks BL1 and BL2 are comprised, both of the half parts 10A and 10B of the lead frame are separated, and further unnecessary portions of the lead frame such as connecting leads are separated. Then, molding for bending the outer lead portions (portions led out of the resin molded portion) of the leads 14 to 17 toward one side is performed, and thus as shown in FIGS. 5 to 7, the outer lead portions of the leads 14 to 17 are drawn out from the gap between the resin molded portions 41 and 42 as lead terminals to complete the semiconductor device 2.

In the semiconductor device, opposite ends of the leads 13 and 18 placed at opposite ends of each chip mounting boards among the plurality of leads 13 to 18 are embedded in the first resin molded portion 41 and the second resin molded portion 42, and the first resin molded portion 41 and the second resin molded portion 42 are mechanically connected via the leads 13 and 18 embedded at the opposite ends in the first resin molded portion and the second resin molded portion.

Figure 6:
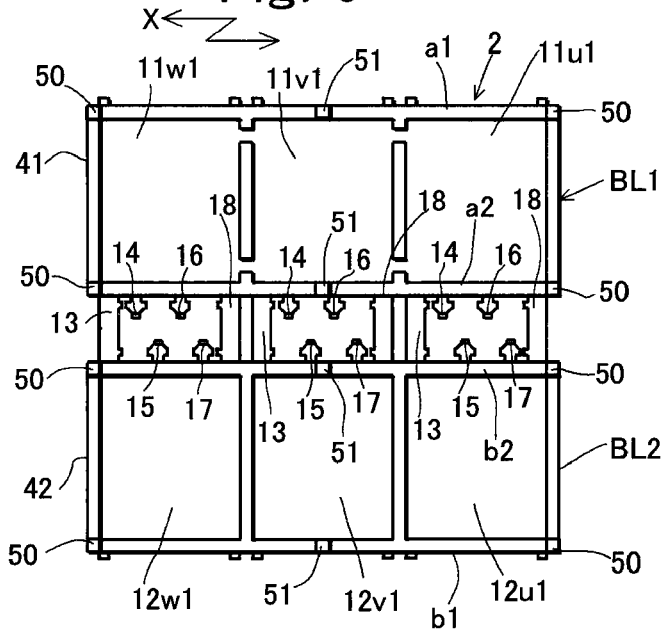
FIG. 6 is a bottom view of the finished product in FIG. 5.
Figure 7:
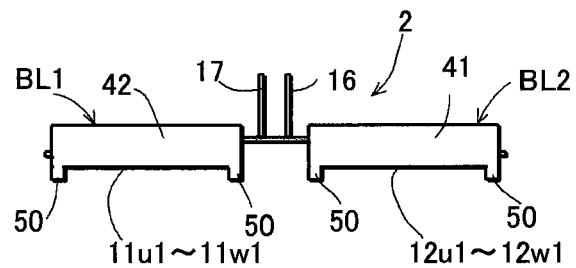
FIG. 7 is a right side view of the finished product in FIG. 5.

As shown in FIG. 6, on one surfaces (back surfaces in the shown example) of the resin molded portions 41 and 42 of the first and second blocks BL1 and BL2, exposed surfaces 11u1 to 11w1 of the chip mounting boards 11u to 11w and exposed surfaces 12u1 to 12w1 of the chip mounting boards 12u to 12w are placed.

In the present invention, as shown in FIG. 6, positioning protrusions 50 that abut against a radiator plate to form a gap to be filled with an adhesive between the exposed surface of each chip mounting board and the radiator plate in bonding the exposed surface of the chip mounting board of each block to the radiator plate are provided near opposite ends of two sides a1, a2 and b1, b2 extending in parallel in a longitudinal direction (X direction in FIG. 6) of at least one surface of the resin molded portion of each of the blocks BL1 and BL2 (at four corners of one surface of each resin molded portion when the resin molded portions 41 and 42 are formed into a rectangular plate shape), and a protrusion height of each positioning protrusion 50 from the exposed surface of the chip mounting board is set so that a predetermined gap is formed between each part of the exposed surface of the chip mounting board of each of the blocks BL1 and BL2 and a radiator plate 52.

In the example in FIG. 6, positioning protrusions 51 are also provided in intermediate portions of the two sides extending in the longitudinal direction of one surface of the resin molded portion of each block. Thus, a total of six positioning protrusions are provided on one surface of each resin molded portion.

Figure 8:
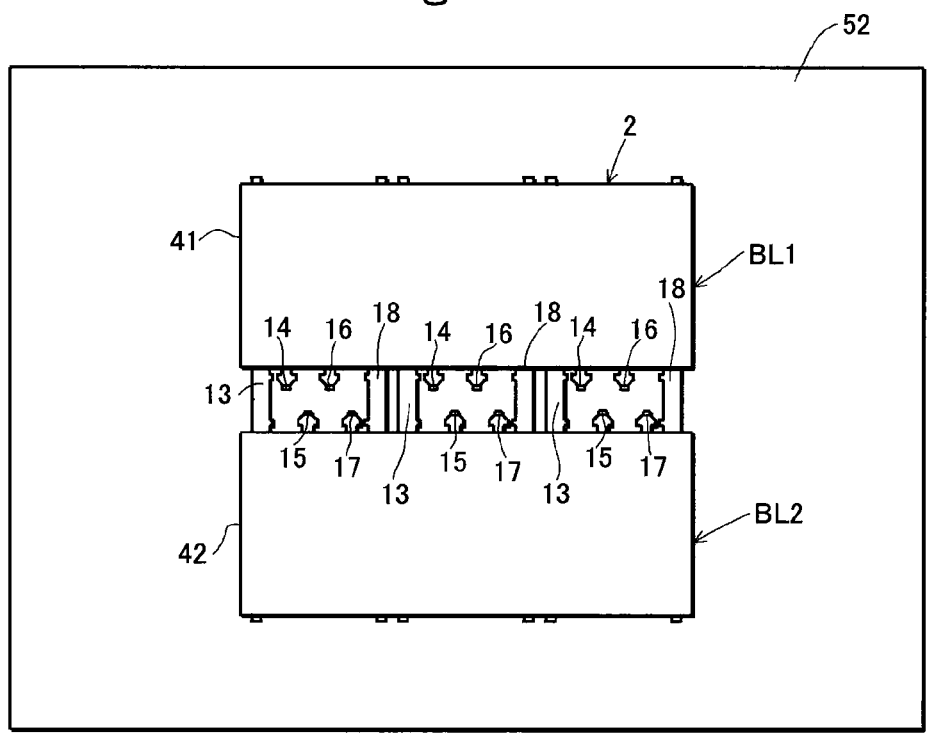
FIG. 8 is a plan view of an electronic device comprised by mounting the resin sealing semiconductor device according to the present invention to a radiator plate.
Figure 9:
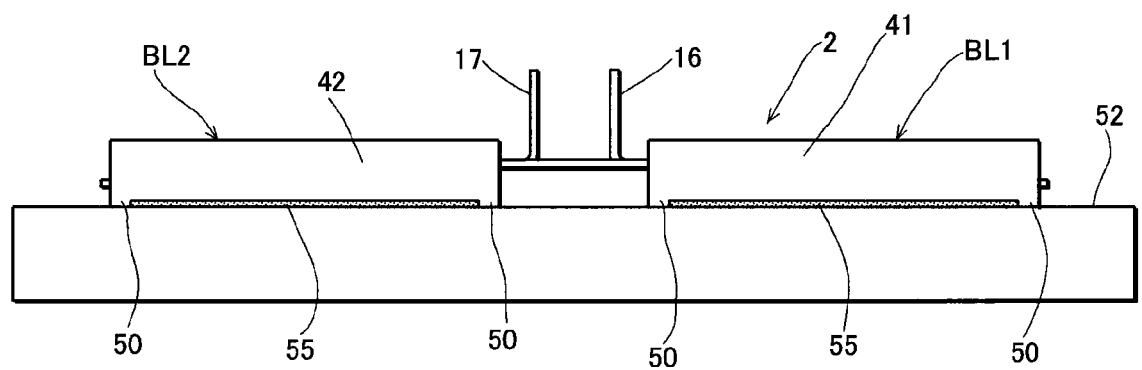
FIG. 9 is a side view of a state where the resin sealing semiconductor device according to the present invention is mounted to the radiator plate.

For the semiconductor device 2 obtained as described above, an adhesive is applied to the exposed surfaces 11u1 to 11w1 and 12u1 to 12w1 of the chip mounting boards 11u to 11w and 12u to 12w, or the adhesive is applied to regions to which the exposed surfaces 11u1 to 11w1 and 12u1 to 12w1 are bonded on the radiator plate 52, and then as shown in FIGS. 8 and 9, the semiconductor device 2 is placed on the radiator plate 52 with one surfaces of the resin molded portions 41 and 42 facing the radiator plate 52. At this time, the positioning protrusions 50 and 51 abut against the radiator plate 52 to form predetermined gaps between the exposed surfaces 11u1 to 11w1 and 12u1 to 12w1 of the chip mounting boards 11u to 11w and 12u to 12w and the radiator plate 52, and with the gaps being filled with insulating and bonding resin 55, the exposed surfaces 11u1 to 11w1 and 12u1 to 12w1 of the chip mounting boards 11u to 11w and 12u to 12w are bonded to the radiator plate 52.

The circuit board (not shown) to which the components that comprise the control circuit 5 in FIG. 1 is placed on the blocks BL1 and BL2 of the semiconductor device 2, the leads 14 to 17 of the semiconductor device 2 are inserted into through holes provided in the circuit board and soldered to a conductive pattern provided on the circuit board. An electronic device is comprised of the resin sealing semiconductor device 2, the radiator plate 52, and the unshown circuit board.

As described above, the positioning protrusions 50 and 51 that abut against the radiator plate 52 to form the gap to be filled with the insulating resin between the exposed surface of each chip mounting board and the radiator plate in mounting the exposed surface of each chip mounting board to the radiator plate 52 are provided integrally with the resin molded portion on one surfaces of the resin molded portions 41 and 42 (sides on which the exposed surfaces of the chip mounting boards are placed), and thus the positioning protrusions 50 and 51 abut against the radiator plate 52 to form the gap of a predetermined size between the exposed surface of the chip mounting board and the radiator plate in abutting the semiconductor device 2 against the radiator plate for mounting the radiator plate 52 to the exposed surface of each chip mounting board. This allows each part of the resin 55 to be filled in the gap between the chip mounting board and the radiator plate to have a set thickness, allowing the radiator plate to be easily mounted to the resin sealing semiconductor device without reducing a voltage-resistance property and a heat dissipation property.

In the above embodiment, it is supposed that there is no warp in the semiconductor device comprising blocks BL1 and BL2. Thus, the positioning protrusions 50 and 51 all have the same protrusion height, and the positioning protrusions 50 and 51 abut against the radiator plate 52 to form predetermined gaps between the exposed surfaces 11u1 to 11w1 and 12u1 to 12w1 of the chip mounting boards 11u to 11w and 12u to 12w and the radiator plate 52.

Figure 10:
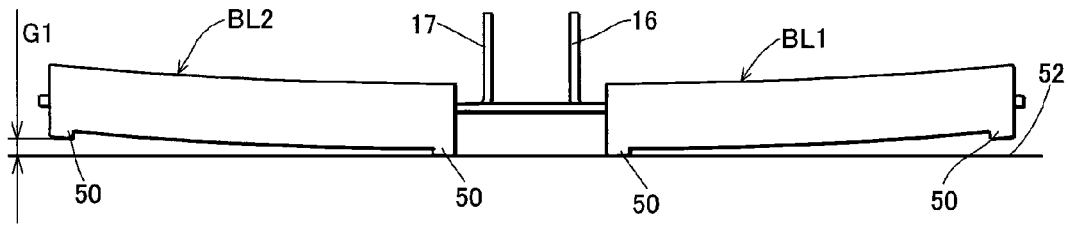
FIG. 10 is a side view for illustrating a problem when a warp occurs in a semiconductor device comprising block of the resin sealing semiconductor device in FIG. 9.

However, in the resin sealing semiconductor device, a difference in thermal expansion coefficient between front surfaces and back surfaces of the semiconductor device comprising blocks BL1 and BL2 often causes warps of the semiconductor device comprising blocks BL1 and BL2. It is now supposed that warps with one surfaces of the resin molded portions 41 and 42 being projecting surfaces occur in the semiconductor device comprising blocks BL1 and BL2 in the width direction. In this case, if the positioning protrusions 50 and 51 all have the same protrusion height, for example, as shown in FIG. 10, opposite ends of the semiconductor device in the width direction rise from the radiator plate 52 to form gaps G1 between the positioning protrusions 50 and 50 placed at the opposite ends in the width direction of the semiconductor device and the radiator plate 52, which makes it difficult to define the gaps between the exposed surfaces of the chip mounting boards and the radiator plate. The warps of the blocks BL1 and BL2 also occur in the longitudinal direction, and thus the positioning protrusions also rise from the radiator plate at the opposite ends in the longitudinal direction of the blocks BL1 and BL2.

Figure 11:
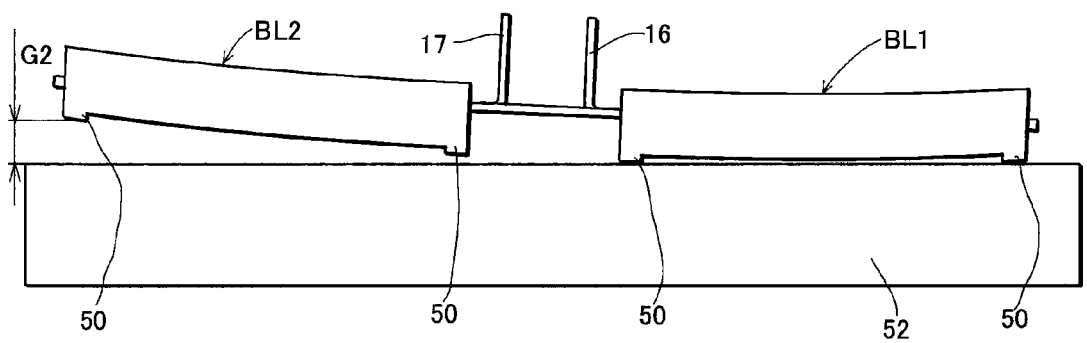
FIG. 11 is a side view for illustrating another problem when a warp occurs in a semiconductor device comprising block of the resin sealing semiconductor device in FIG. 9.

As shown in FIG. 10, when the above described warps occur in the blocks BL1 and BL2 of the semiconductor device 2, if the positioning protrusions 50 provided at the opposite ends in the width direction of one semiconductor device comprising block BL1 are forcefully abutted against the radiator plate 52 as shown in FIG. 11, the other block BL2 further rises from the radiator plate to increase the gap between the positioning protrusion 50 on the outside of the block BL2 and the radiator plate 52 from G1 to G2. Such a state further makes it difficult to define a gap between the exposed surface of the chip mounting board and the radiator plate 52 on the side of the block BL2.

Thus, in the present invention, a protrusion height of each positioning protrusion is set so that each positioning protrusion abuts against the radiator plate to form a gap of an appropriate size between the exposed surface of each chip mounting board and the radiator plate in bonding the radiator plate to the exposed surface of each chip mounting board, even if a warp occurs in the semiconductor device comprising blocks BL1 and BL2.

As described above, for each positioning protrusion to be abutted against the radiator plate to define a gap between the exposed surface of the chip mounting board and the radiator plate even if warps occur in the semiconductor device comprising blocks in bonding the exposed surfaces of the chip mounting boards of the blocks BL1 and BL2 to the radiator plate 52, a state of the warps that occur in the blocks BL1 and BL2 needs to be predictable in bonding the exposed surfaces of the chip mounting boards of the blocks BL1 and BL2 to the radiator plate.

Thus, in the present invention, each block is comprised so that a warp with one surface of the resin molded portion of each of the blocks BL1 and BL2 being a projecting surface occur in each of the blocks BL1 and BL2 under a temperature environment (for example, 20° C.) in mounting the exposed surfaces of the chip mounting boards of the blocks BL1 and BL2 to the radiator plate 52, by a difference in thermal expansion coefficient between one surface of each of the resin molded portions 41 and 42 (side on which the exposed surface of the chip mounting board is placed) and the other surface of each of the resin molded portions 41 and 42 of the blocks BL1 and BL2.

Then, the positioning protrusions 50 having a protrusion length such that the positioning protrusions 50 can abut against the radiator plate with the warps of the blocks BL1 and BL2 maintained to form a gap to be filled with resin between the exposed surface of each chip mounting board and the radiator plate in mounting the radiator plate 52 to the exposed surface of each of the chip mounting boards $11u$ to $11w$ and $12u$ to $12w$ of the blocks BL1 and BL2 are provided near the opposite ends of the two sides extending in the longitudinal direction of at least one surface of the resin molded portion of each block, and the height of each positioning protrusion is set so that the gap to be filled with resin can be formed between each part of the exposed surface of the chip mounting board of each block and the radiator plate.

Figure 12:
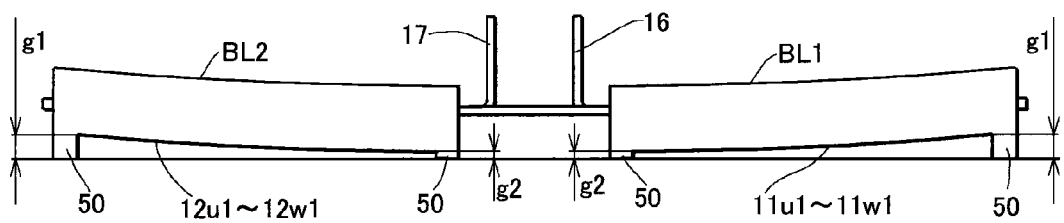
FIG. 12 is a side view of another embodiment of the present invention that solves the problems in FIG. 10 and FIG. 11.

When the warps shown in, for example, FIGS. 10 and 11 occur in the blocks BL1 and BL2, as shown in FIG. 12, a protrusion height g1 of the positioning protrusions 50 provided at ends apart from each other among the opposite ends in the width direction of the blocks BL1 and BL2 is set to be higher than a protrusion height g2 of the positioning protrusions 50 and 50 provided at adjacent ends in the width direction of the blocks BL1 and BL2 so that all the positioning protrusions 50 abut against the radiator plate 52 even when the warps occur in the width direction of the blocks BL1 and BL2.

As described above, when each block has the warp with one surface of the resin molded portion being the projecting surface, and no positioning protrusion is provided in connecting the exposed surface of the chip mounting board of each block to the radiator plate 52, part of the exposed surface of the chip mounting board is brought into direct contact with the radiator plate to prevent insulation between the chip mounting board and the radiator plate. On the other hand, as in the present invention, in view of the warps of the blocks BL1 and BL2, the positioning protrusions are provided so as to form the gap between the exposed surface of the chip mounting board and the radiator plate at each part of the blocks BL1 and BL2, thereby preventing the exposed surface of the chip mounting board from being brought into direct contact with the radiator plate.

Figure 13:
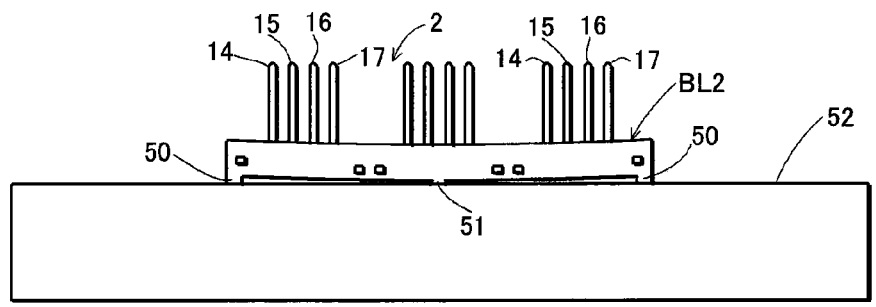
FIG. 13 is a front view of a state where a resin sealing semiconductor device according to a further embodiment of the present invention is mounted to the radiator plate.

As described above, when the positioning protrusions 50 that can abut against the radiator plate with the warps of the blocks BL1 and BL2 maintained in bonding the radiator plate 52 to the exposed surfaces of the chip mounting boards $11u$ to $11w$ and $12u$ to $12w$ of the blocks BL1 and BL2 are provided on one surfaces of the resin molded portions 41 and 42 to form the gap to be filled with resin between the exposed surface of each chip mounting board and the radiator plate, the gaps formed between the exposed surfaces of the chip mounting boards of the blocks BL1 and BL2 and the radiator plate 52 become the narrowest near a middle portion in the longitudinal direction of each block, and gradually become wider from the middle portion toward the opposite sides in the longitudinal direction of each block as shown in FIG. 13.

Thus, when the warps occur in the semiconductor device comprising blocks BL1 and BL2, the gap between the exposed surface of the chip mounting board of each block and the radiator plate is not uniform, but no problem occurs if the size of the gap formed between the exposed surface of the chip mounting board and the radiator plate near the middle portion in the longitudinal direction of each block is set to the minimum necessary size for insulation between the chip mounting board and the radiator plate. The size of the gap formed between the exposed surface of the chip mounting board and the radiator plate near the middle portion in the longitudinal direction of each block (thickness of the thinnest portion of an insulation resin layer) can be set according to the height of the positioning protrusion 51 provided in the intermediate portion of each of the two sides extending in the longitudinal direction of one surface of the resin molded portion of each block.

When warps with one surfaces of the resin molded portions 41 and 42 being projecting surfaces occur in the semiconductor device comprising blocks BL1 and BL2, the warps are actively used to provide a good temperature balance of the resin sealing semiconductor device 2. Specifically, the warps that occur in the semiconductor device comprising blocks BL1 and BL2 are used to form the gap between the exposed surface of the chip mounting board and the radiator plate so that the gap becomes the narrowest near the middle portion in the longitudinal direction of each of the blocks BL1 and BL2, and gradually becomes wider from the middle portion toward the opposite ends in the longitudinal direction of each of the blocks BL1 and BL2, thereby obtaining an advantage described below.

Near the middle portion in the longitudinal direction of the horizontally oriented blocks BL1 and BL2, heat generated from the semiconductor chip tends to be stored in the resin molded portions 41 and 42, and there are many other semiconductor chips adjacent to each semiconductor chip and each semiconductor chip is heated by heat from the other semiconductor chips, which tends to increase temperatures of the blocks BL1 and BL2. If the temperatures of the blocks BL1 and BL2 are locally increased, thermal runaway may occur in the semiconductor chip in each block to cause breakage of the semiconductor chip.

Thus, as in the present invention, the gap between the exposed surface of the chip mounting board and the radiator plate has the minimum necessary size for dielectric strength near the middle portion in the longitudinal direction of the blocks BL1 and BL2, thereby allowing good temperature transfer from the chip mounting board to the radiator plate near the middle portion in the longitudinal direction of each of the blocks BL1 and BL2, and preventing a local temperature increase near the middle portion of each of the blocks BL1 and BL2.

Near the opposite ends in the longitudinal direction of the blocks BL1 and BL2, the gap between the exposed surface of the chip mounting board and the radiator plate becomes wider (the adhesive layer becomes thicker) to prevent temperature transfer from the chip mounting board to the radiator plate, but near the opposite ends of the blocks BL1 and BL2, little heat is stored in the resin molded portion, and also there are a small number of other semiconductor chips adjacent to the semiconductor chip therein, thereby preventing a local temperature increase even if the gap between the exposed surface of the chip mounting board and the radiator plate is wide to some extent.

As described above, the gap formed between the exposed surface of the chip mounting board and the radiator plate 52 of each of the semiconductor device comprising blocks BL1 and BL2 becomes the narrowest near the middle portion in the longitudinal direction of the blocks BL1 and BL2, and gradually becomes wider from the middle portion toward the opposite ends in the longitudinal direction of the blocks BL1 and BL2. This provides good heat transfer to the radiator plate 52 near the middle portion in the longitudinal direction of the blocks BL1 and BL2 where the temperature of the semiconductor chip therein tends to increase, and prevents the heat transfer from the blocks BL1 and BL2 to the radiator plate near the opposite ends of the blocks BL1 and BL2 where the temperature of the semiconductor chip therein gently increases, thereby allowing a good temperature balance of the entire block, and preventing a local temperature increase in the block to cause thermal runaway of the element therein.

In implementing the present invention, an amount of warp of the blocks BL1 and BL2 needs to be predictable in determining proper values of the positioning protrusions 50 and 51. Generally, if the ambient temperature is constant, the amount of warp of the semiconductor device comprising block is constant, and thus the temperature in bonding the semiconductor device to the radiator plate is controlled to be maintained constant (the semiconductor device is bonded to the radiator plate in a room where the temperature is controlled to be constant), thereby allowing an always constant proper value of the protrusion size of each positioning protrusion, and preventing a reduction in mass productivity of the semiconductor device.

As in the embodiment, the chip mounting boards are divided into the first group A and the second group B, and the semiconductor chips mounted to the chip mounting boards in the first group and the semiconductor chips mounted to the chip mounting boards in the second group are separately sealed by the first resin molded portion 41 and the second resin molded portion 42. This can reduce the number of heat generation elements placed in one resin molded portion as compared with the case where the entire chip mounting boards are sealed by one resin molded portion, thereby increasing a heat dissipation property from the chip mounting boards, and preventing a temperature increase of the semiconductor device.

As in the embodiment, only the fourth to sixth diodes Dx to Dz that generate a large amount of heat are mounted to the chip mounting boards 11u to 11w in the first group of the lead frame 10, and the first to third diodes Du to Dw and the first to third thyristors Thx to Thz that generate a small amount of heat are mounted to the chip mounting boards 12u to 12w in the second group, thereby allowing a heat generation source to be distributed, and preventing a temperature increase of the semiconductor device.

Figure 14:
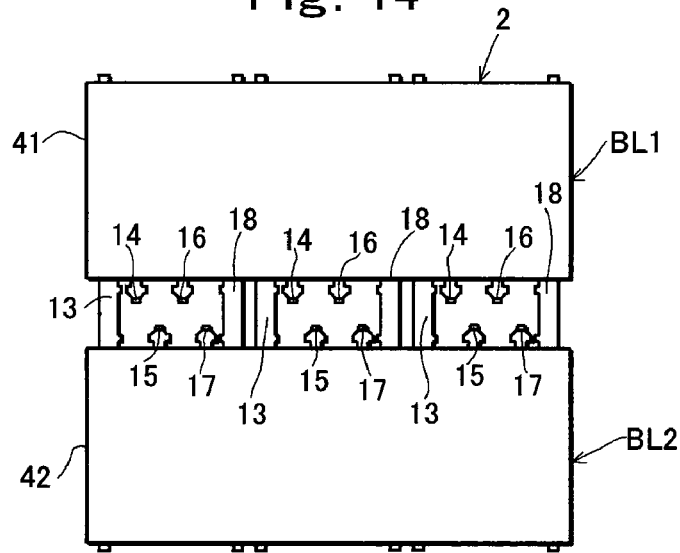
FIG. 14 is a plan view of a resin sealing semiconductor device according to a further embodiment of the present invention.
Figure 15:
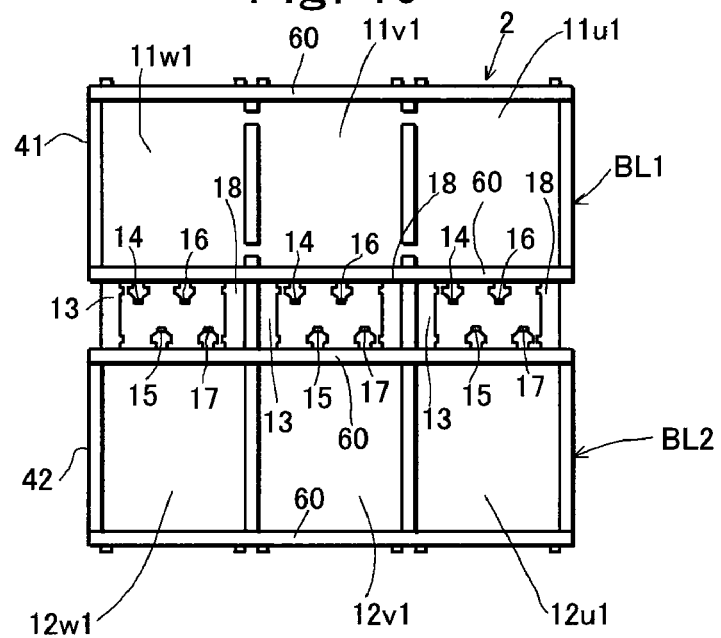
FIG. 15 is a bottom view of the resin sealing semiconductor device in FIG. 14.
Figure 16:
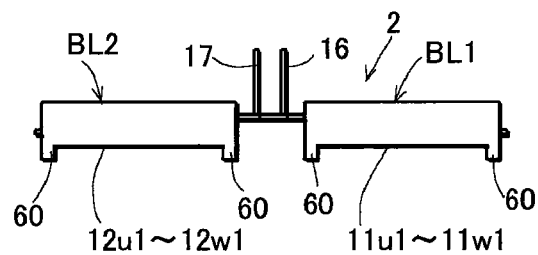
FIG. 16 is a right side view of the resin sealing semiconductor device in FIG. 14.

FIGS. 14 to 16 show another embodiment of the present invention. In this embodiment, a pair of rib-shaped positioning protrusions 60 and 60 extending in parallel in the longitudinal direction of the resin molded portions 41 and 42 are provided at opposite ends in the width direction of one surfaces of the resin molded portions 41 and 42 of the semiconductor device comprising blocks BL1 and BL2, and the pair of positioning protrusions 60 and 60 abut against the radiator plate to form a gap to be filled with the insulating and bonding resin between the exposed surface of each chip mounting board and the radiator plate in bonding the radiator plate to the exposed surface of the chip mounting board of each of the blocks BL1 and BL2. Other points are the same as in the embodiment in FIGS. 2 to 7.

As described above, the pair of rib-shaped positioning protrusions 60 and 60 are provided at the opposite ends in the width direction of one surface of the resin molded portion of each block, each resin molded portion is reinforced and prevented from warping, thereby allowing the gap between the exposed surface of the chip mounting board of each block and the radiator plate to be substantially uniform, and allowing a thickness of an insulation layer provided between the chip mounting board and the radiator plate to be substantially uniform.

Figure 17:
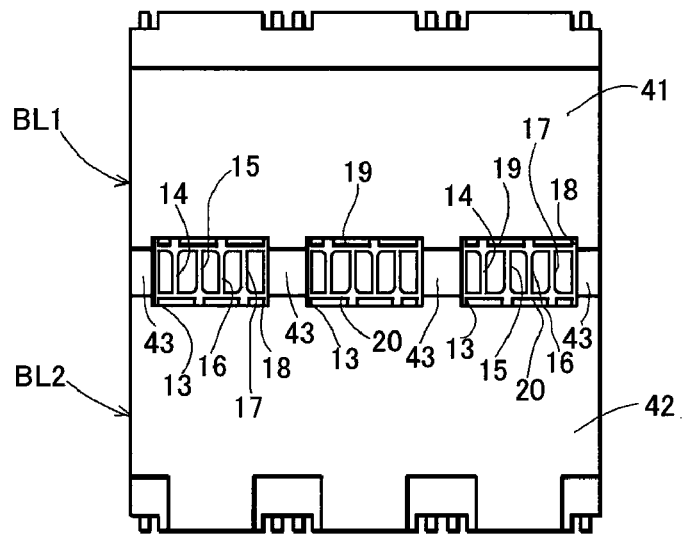
FIG. 17 is a plan view of a workpiece of a resin sealing semiconductor device according to a further embodiment of the present invention.
Figure 18:
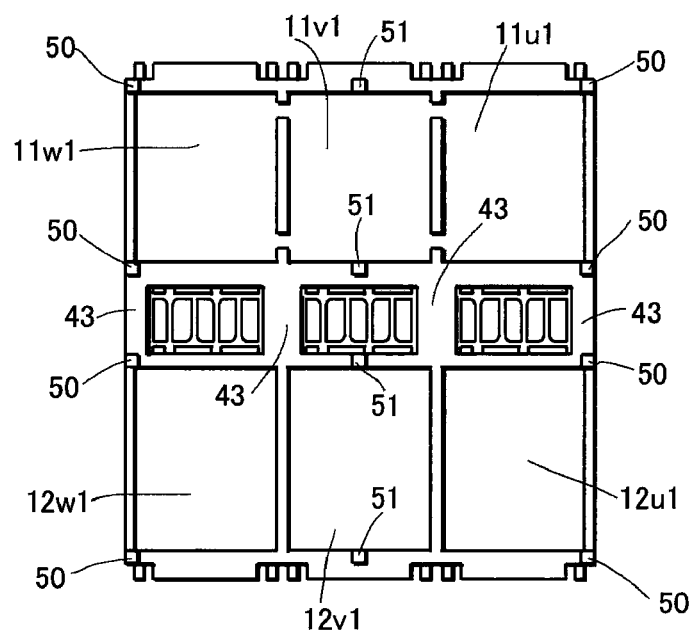
FIG. 18 is a bottom view of the resin sealing semiconductor device in FIG. 17.
Figure 19:
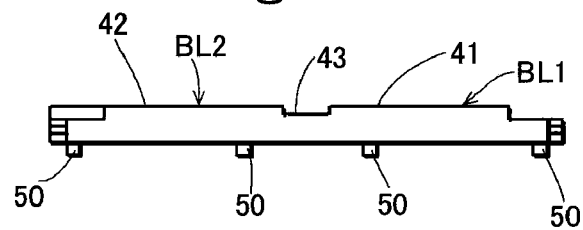
FIG. 19 is a right side view of the resin sealing semiconductor device in FIG. 17.

In the above described embodiments, the first resin molded portion 41 and the second resin molded portion 42 are connected via the leads 13 and 18 and not connected via resin, but as shown in FIG. 17 to FIG. 19, it is preferable that a connecting resin molded portion 43 that covers the plurality of leads 13 and 18 that comprise the connecting portion is formed of the same resin as the resin for the first resin molded portion 41 and the second resin molded portion 42 across the resin molded portions, and the connecting resin molded portion 43 also mechanically connects between the first resin molded portion 41 and the second resin molded portion 42. FIG. 17 to FIG. 19 show a state before the connecting leads 19 and 20 are separated.

Also in the embodiment, as shown in FIG. 18, positioning protrusions 50 that abut against the radiator plate to form a gap to be filled with an adhesive between the exposed surface of each chip mounting board and the radiator plate in bonding the exposed surface of the chip mounting board of each block to the radiator plate are provided near opposite ends of two sides extending in parallel in the longitudinal direction of one surface of the resin molded portion of each of the blocks BL1 and BL2, and a protrusion height of each positioning protrusion 50 from the exposed surface of the chip mounting board is set so that a predetermined gap is formed between each part of the exposed surface of the chip mounting board of each of the blocks BL1 and BL2 and the radiator plate 52. In the shown example, positioning protrusions 51 are also provided in intermediate portions of the two sides extending in the longitudinal direction of one surface of the resin molded portion of each block.

When the connecting portion connecting between the first resin molded portion 41 and the second resin molded portion 42 is formed of a lead only, the lead that comprises the connecting portion may be bent when an external force is applied to each resin molded portion perpendicularly to a plate surface of the lead frame. On the other hand, the connecting resin molded portion is provided so as to cover the lead that comprises the connecting portion as described above, thereby increasing mechanical strength of the connecting portion connecting between the resin molded portions.

Also, when the first resin molded portion 41 and the second resin molded portion 42 are connected by the lead only, resin injection ports need to be provided in both of a cavity provided in a transfer molding die for molding the first resin molded portion 41 and a cavity provided in a transfer molding die used for molding the second resin molded portion 42 in molding the first resin molded portion 41 and the second resin molded portion 42, which makes a structure of the die complicated and inevitably increases cost of the die.

On the other hand, when the connecting resin molded portion 43 is provided, communication can be provided between a cavity for molding the first resin molded portion and a cavity for molding the second resin molded portion via a cavity for molding the connecting resin molded portion in molding the first resin molded portion 41 and the second resin molded portion 42 using a transfer molding die, and thus resin can be injected into the cavities for molding both the resin molded portions from either the cavity for molding the first resin molded portion or the cavity for molding the second resin molded portion. Thus, a die for molding the first resin molded portion 41 and the second resin molded portion 42 has a simple structure in which a resin injection port is provided in only one of the cavity for molding the first resin molded portion and the cavity for molding the second resin molded portion, thereby reducing cost of the die.

When the lead connecting between the first resin molded portion and the second resin molded portion cannot be provided, a resin connecting portion having one end integral with the first resin molded portion 41 and the other end integral with the second resin molded portion 42 may be provided across the first resin molded portion 41 and the second resin molded portion 42 to connect between the first resin molded portion and the second resin molded portion, instead of providing the connecting resin molded portion 43 with the lead covered as described above.

Figure 20A:
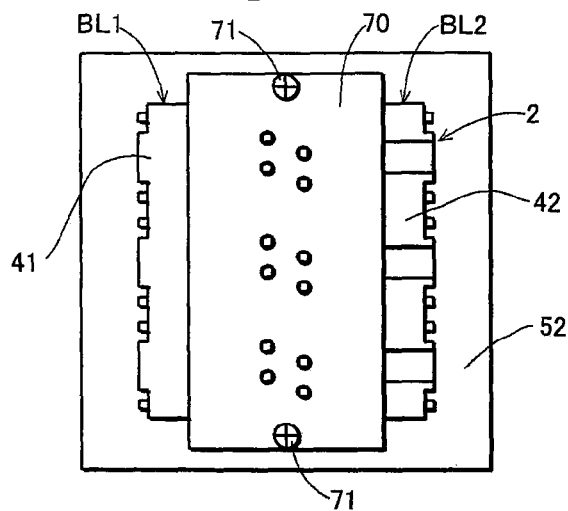
FIG. 20(A) and FIG. 20(B) are a plan view and a front view of a resin sealing semiconductor device according to a further embodiment of the present invention.
Figure 20B:
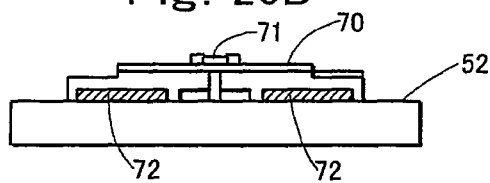

FIGS. 20(A) and 20(B) show a further embodiment of an electronic device of the present invention. In this example, a series of outer leads of the resin sealing semiconductor device are led out on a side opposite from the radiator plate 52. On the two blocks BL1 and BL2 of the resin sealing semiconductor device, a circuit board 70 to which components of the control circuit 5 are mounted is placed, and the series of outer leads of the resin sealing semiconductor device are inserted into through holes 70*t* formed in the circuit board 70, and soldered to a conductive pattern on the circuit board 70. Then, the circuit board 70 is fastened to the radiator plate 52 by screws 71, and the resin sealing semiconductor device 2 is secured to the radiator plate 52 while being pressed by the circuit board 70. In this example, an insulation sheet 72, instead of the adhesive, is inserted into a gap between the exposed surface of the chip mounting board of each block of the resin sealing semiconductor device and the radiator plate, and the insulation sheet insulates between the exposed surface of the chip mounting board of each block of the resin sealing semiconductor device and the radiator plate. The insulation sheet used is made of material having high heat conductivity and elasticity so as to be inserted into the gap between the exposed surface of the chip mounting board of each block of the resin sealing semiconductor device and the radiator plate in a compressed manner (in close contact with the exposed surface of the chip mounting board of each block and the radiator plate).

Figure 21A:
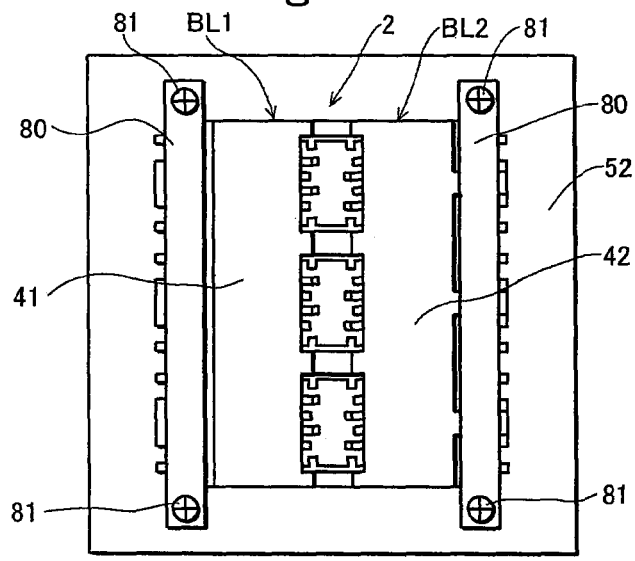
FIG. 21(A) and FIG. 21(B) are a plan view and a front view of a resin sealing semiconductor device according to a further embodiment of the present invention.
Figure 21B:
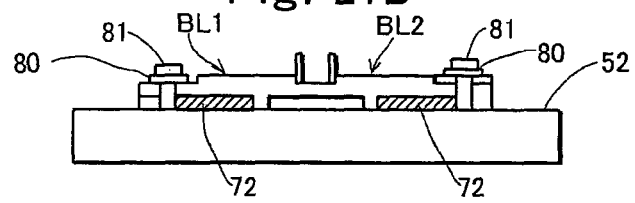

FIGS. 21(A) and 21(B) show a further embodiment of an electronic device of the present invention. Also in this example, a series of outer leads of the resin sealing semiconductor device are led out on a side opposite from the radiator plate 52. Two presser plates 80 and 80 are placed on surfaces on a side opposite from the radiator plate 52 of the two blocks BL1 and BL2 of the resin sealing semiconductor device 2, and an insulation sheet 72 is inserted into a gap formed between each part of the exposed surface of the chip mounting board of each block and the radiator plate. The two presser plates 80 and 80 are fastened to the radiator plate 52 by screws 81, and the two blocks BL1 and BL2 of the resin sealing semiconductor device are secured to the radiator plates 52 while being pressed by the presser plates 80 and 80.

Figure 22:
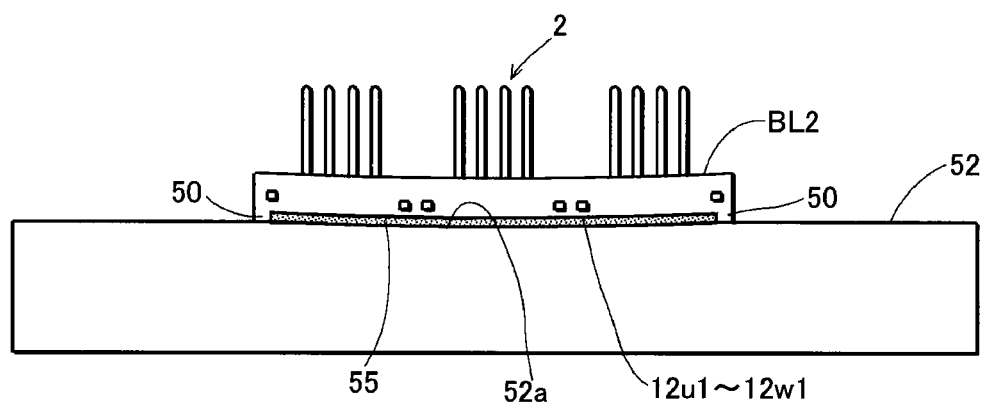
FIG. 22 is a front view of a resin sealing semiconductor device according to a further embodiment of the present invention.

In the above described embodiment, when the warps occur in the blocks BL1 and BL2 of the resin sealing semiconductor device, the gap between the exposed surface of the chip mounting board of each block and the radiator plate is not uniform, but a recessed surface facing the exposed surface of the chip mounting board may be formed in the radiator plate so that the gap between the exposed surface of the chip mounting board of each block and the radiator plate becomes uniform. Specifically, as shown in FIG. 22, a recessed surface 52*a* curving at substantially the same curvature as a facing projecting surface may be formed in a region of the radiator plate 52 facing one surface that warps to form the projecting surface, of the resin molded portion of each block of the resin sealing semiconductor device 2, and a gap having a substantially uniform size over the entire exposed surface of the chip mounting board of each block may be formed between the exposed surface of the chip mounting board of each block of the resin sealing semiconductor device and the recessed surface 52*a* provided in the radiator plate 52.

Such a construction allows the adhesive layer provided between the exposed surface of the chip mounting board of each block and the radiator plate to have a uniform thickness.

In the above description, the semiconductor device used in the three-phase short-circuit type voltage regulator in FIG. 1 is taken as an example, but the present invention may be applied to a semiconductor device that comprises a different power circuit such as an inverter circuit.

The preferred embodiments of the present invention have been described above, but the number of chip mounting boards provided in the semiconductor device comprising blocks BL1 and BL2, the number of the leads, and the arrangement pattern thereof are not limited to those in the above described embodiments, and may be changed according to a construction of a circuit in the semiconductor device. The present invention is not limited to the case of using the semiconductor chip for electric power as in the embodiments, but it should be understood that the present invention may be applied to a semiconductor device comprised using a semiconductor chip through which a relatively small current flows.

In the above described embodiments, the lead frame including the three chip mounting boards in the first group and the three chip mounting boards in the second group is used, but in the present invention, generally, a lead frame may be used having a structure in which first to n-th (n is an integer equal to or larger than one) chip mounting boards in the first group arranged in the longitudinal direction of the frame are provided at one end in the width direction of the frame, and first to m-th (m is an integer equal to or larger than one) chip mounting boards in the second group arranged in the longitudinal direction of the frame are provided at the other end in the width direction, and a lead group including a plurality of leads corresponding to the chip mounting boards are provided between the chip mounting boards in the first group and the chip mounting boards in the second group. The above described m and n may be equal or not.

In the embodiment, the case of using the lead frame for producing two semiconductor devices at one time is taken as an example, but it should be understood that the present invention may be applied to the case of using a lead frame for producing one semiconductor device or three or more semiconductor devices at one time.

In the embodiments, the semiconductor chips are placed in the position close to the end on the lead side of the chip mounting board so that the connecting wire connecting between the semiconductor chip and the predetermined lead becomes as short as possible, but the present invention is not limited to the case of mounting the semiconductor chips in this manner, each semiconductor chip may be mounted to a middle portion of the chip mounting board. When each semiconductor chip is mounted to the middle portion of the chip mounting board, the connecting wire connecting between each semiconductor chip and the lead becomes long, but a heat dissipation property from the semiconductor chip can be increased.

In the embodiment, except the example in FIG. 22, six positioning protrusions are provided on one surface of the resin molded portion of each semiconductor device comprising block. For stably supporting each semiconductor device comprising block on the radiator plate, at least four positioning protrusions are preferably provided near the opposite ends of each of the two sides extending in the longitudinal direction of one surface of the resin molded portion of each block, but the present invention is not limited to such a construction, and for example, three positioning protrusions may be provided on one surface of the resin molded portion of each semiconductor device comprising block, and the positioning protrusions are abutted against the radiator plate to form a gap between the exposed surface of the chip mounting board of each block and the radiator plate. When a positioning protrusion having a large contact area with the radiator plate is used, the gap between the exposed surface of the chip mounting board of each block and the radiator plate can be maintained simply by providing two positioning protrusions with space therebetween in the longitudinal direction of each semiconductor device comprising block on one surface of the resin molded portion of each semiconductor device comprising block. Specifically, a plurality of positioning protrusions may be provided on one surface of the resin molded portion of each semiconductor device comprising block.

In the embodiment, the resin sealing semiconductor device is divided into the pair of semiconductor device comprising blocks BL1 and BL2, but it should be understood that the present invention may be applied to a resin sealing semiconductor device including a single block.

In the present invention, resin provided between the exposed surface of each chip mounting board and the radiator plate may be insulating and bonding resin, but it should be understood that the resin preferably has high heat conductivity for providing good heat transfer between the chip mounting board and the radiator plate. Specifically, the resin provided between the exposed surface of each chip mounting board and the radiator plate preferably has high heat conductivity as well as insulating and bonding properties. As such resin, an adhesive conventionally used for bonding a chip mounting board to a radiator plate can be, of course, used, but resin having high heat conductivity and bonding and insulating properties may be selected from resin that is not commercially available as an adhesive. As resin having high heat conductivity and bonding and insulating properties, for example, silicone resin (KE1867) sold by Shin-Etsu Chemical Co., Ltd. may be used.

What is claimed is:

1. A resin sealing semiconductor device having a structure in which a portion to be sealed of components including at least one chip mounting board having a front surface that is a chip mounting surface and a back surface that is at least partly an exposed surface, a semiconductor chip mounted to the front surface of each chip mounting board, and a plurality of leads provided correspondingly to each chip mounting board and having inner lead portions connected to an electrode of the semiconductor chip on the corresponding chip mounting board via a connecting wire is embedded in a resin molded portion molded into a generally plate shape, and outer lead portions of said plurality of leads are led out in line from a side surface at one end in a width direction of said resin molded portion, and the exposed surface of each chip mounting board is placed on one surface of said resin molded portion, wherein a plurality of positioning protrusions are provided integrally with said resin molded portion on one surface of said resin molded portion, and a protrusion height of said positioning protrusions is set so that a gap to be filled with insulating resin is formed between each part of the exposed surface of each chip mounting board and a radiator plate when said positioning protrusions are abutted against the radiator plate.

2. A resin sealing semiconductor device in which a pair of semiconductor device comprising blocks are provided each having a structure in which a portion to be sealed of components including at least one chip mounting board having a front surface that is a chip mounting surface and a back surface that is at least partly an exposed surface, a semiconductor chip mounted to the front surface of each chip mounting board, and a plurality of leads provided correspondingly to each chip mounting board and having inner lead portions connected to an electrode of the semiconductor chip on the corresponding chip mounting board via a connecting wire is embedded in a resin molded portion molded into a generally plate shape, and outer lead portions of said plurality of leads are led out in line from a side surface at one end in a width direction of said resin molded portion, and the exposed surface of each chip mounting board is placed on one surface of said resin molded portion, said pair of blocks are mechanically connected by a connecting portion with the side surfaces from which outer leads of the resin molded portions are drawn out facing each other, and the outer lead portions led out of said pair of blocks are drawn out through a gap formed between said pair of blocks, wherein a plurality of positioning protrusions are provided integrally with said resin molded portion on one surface of the resin molded portion of said each block, and a protrusion height of said positioning protrusions is set so that a gap to be filled with insulating resin is formed between each part of the exposed surface of each chip mounting board of each block and a radiator plate when said positioning protrusions are abutted against the radiator plate.

3. A resin sealing semiconductor device in which a pair of semiconductor device comprising blocks are provided each having a structure in which a portion to be sealed of components including a plurality of chip mounting boards each having a front surface that is a chip mounting surface and a back surface that is at least partly an exposed surface and arranged in line on one plane, a semiconductor chip mounted to the front surface of each chip mounting board, and a plurality of leads provided correspondingly to each chip mounting board and having inner lead portions connected to an electrode of the semiconductor chip on the corresponding chip mounting board via a connecting wire is embedded in a resin molded portion molded into a generally horizontally oriented plate shape, and outer lead portions of the plurality of leads are led out in line in a longitudinal direction of the resin molded portion from a side surface at one end in a width direction of said resin molded portion, and an exposed surface of each chip mounting board is placed on one surface of said resin molded portion, said pair of blocks are mechanically connected by a connecting portion with the side surfaces from which outer leads of the resin molded portions are drawn out facing each other, and the outer lead portions led out of said pair of blocks are drawn out through a gap formed between said pair of blocks, wherein each block is comprised so that a warp with said one surface of the resin molded portion of each block being a projecting surface occurs in each block under a temperature environment in mounting the exposed surface of the chip mounting board of each block to the radiator plate, by a difference in thermal expansion coefficient between one surface of the resin molded portion of said each block and the other surface of the resin molded portion of each block, positioning protrusions protruding from one surface of the resin molded portion of said each block are provided integrally with said resin molded portion near opposite ends of two sides extending in a longitudinal direction of at least one surface of the resin molded portion of said each block, and said positioning protrusions are provided to abut against said radiator plate with the warp of each block maintained, and a protrusion height of said positioning protrusions is set so that a gap to be filled with insulating resin is formed between each part of the exposed surface of the chip mounting board of each block and a radiator plate when said positioning protrusion is abutted against the radiator plate.

4. A resin sealing semiconductor device in which a pair of semiconductor device comprising blocks are provided each having a structure in which a portion to be sealed of components including three chip mounting boards each having a front surface that is a chip mounting surface and a back surface that is at least partly an exposed surface and arranged in line on one plane, a three-phase semiconductor chip mounted to the front surfaces of said three chip mounting boards, and a plurality of leads provided correspondingly to each chip mounting board and having inner lead portions connected to an electrode of the semiconductor chip on the corresponding chip mounting board via a connecting wire is embedded in a resin molded portion molded into a horizontally oriented plate shape, and outer lead portions of said plurality of leads are led out in line in a longitudinal direction of said resin molded portion from a side surface at one end in a width direction of said resin molded portion, and an exposed surface of each chip mounting board is placed on one surface of said resin molded portion, said pair of blocks are mechanically connected by a connecting portion with the side surfaces from which outer leads of the resin molded portions are drawn out facing each other, the outer lead portions led out of said pair of blocks are drawn out through a gap formed between said pair of blocks, and the pair of blocks are connected so that the three-phase semiconductor chip provided in each of the pair of blocks comprises a three-phase bridge circuit, wherein each block is comprised so that a warp with said one surface of the resin molded portion of each block being a projecting surface occurs in each block under a temperature environment in mounting the exposed surface of the chip mounting board of each block to the radiator plate, by a difference in thermal expansion coefficient between one surface of the resin molded portion of said each block and the other surface of the resin molded portion of each block, positioning protrusions protruding from one surface of the resin molded portion of said each block are provided integrally with said resin molded portion near opposite ends of two sides extending in a longitudinal direction of at least one surface of the resin molded portion of said each block, and said positioning protrusions are provided to abut against said radiator plate with the warp of each block maintained, and a protrusion height of said positioning protrusions is set so that a gap to be filled with insulating resin is formed between each part of the exposed surface of the chip mounting board of each block and a radiator plate when said positioning protrusion is abutted against the radiator plate.

5. The resin sealing semiconductor device according to claim 3 or 4, wherein said positioning protrusions are provided so that the gap formed between the exposed surface of said chip mounting board and the radiator plate becomes the narrowest in a middle portion in the longitudinal direction of each block, and gradually becomes wider toward opposite ends in the longitudinal direction of each block.

6. A resin sealing semiconductor device in which a pair of semiconductor device comprising blocks are provided each having a structure in which a portion to be sealed of components including a plurality of chip mounting boards each having a front surface that is a chip mounting surface and a back surface that is at least partly an exposed surface and arranged in line on one plane, a semiconductor chip mounted to the front surface of each chip mounting board, and a plurality of leads provided correspondingly to each chip mounting board and having inner lead portions connected to an electrode of the semiconductor chip on the corresponding chip mounting board via a connecting wire is embedded in a resin molded portion molded into a generally horizontally oriented plate shape, and outer lead portions of said plurality of leads are led out in line in a longitudinal direction of the resin molded portion from a side surface at one end in a width direction of said resin molded portion, and an exposed surface of each chip mounting board is placed on one surface of said resin molded portion, said pair of blocks are mechanically connected by a connecting portion with the side surfaces from which outer leads of the resin molded portions are drawn out facing each other, and the outer lead portions led out of said pair of blocks are drawn out through a gap formed between said pair of blocks, wherein a pair of rib-shaped positioning protrusions extending in parallel in the longitudinal direction of said resin molded portion are provided at opposite ends in the width direction of one surface of the resin molded portion of each block, and a height of said positioning protrusions is set so that a gap to be filled with insulating resin is formed between the exposed surface of each chip mounting board and a radiator plate when said positioning protrusions are abutted against the radiator plate.

7. An electronic device comprising:

a resin sealing semiconductor device having a structure in which a portion to be sealed of components including at least one chip mounting board having a front surface that is a chip mounting surface and a back surface that is at least partly an exposed surface, a semiconductor chip mounted to the front surface of each chip mounting board, and a plurality of leads provided correspondingly to each chip mounting board and having inner lead portions connected to an electrode of the semiconductor chip on the corresponding chip mounting board via a connecting wire is embedded in a resin molded portion molded into a generally plate shape, and outer lead portions of said plurality of leads are led out in line from a side surface at one end in a width direction of said resin molded portion, and the exposed surface of each chip mounting board is placed on one surface of said resin molded portion; and a radiator plate that is connected to the exposed surface of the chip mounting board of said resin sealing semiconductor device in a heat transfer manner, wherein a plurality of positioning protrusions are provided on one surface of the resin molded portion of said resin sealing semiconductor device, and said positioning protrusions are abutted against said radiator plate to form a gap between the exposed surface of each chip mounting board and the radiator plate, and the gap between the exposed surface of said each chip mounting board and the radiator plate is filled with insulating and bonding resin to bond the exposed surface of each chip mounting board to said radiator plate.

8. An electronic device comprising:

a resin sealing semiconductor device in which a pair of semiconductor device comprising blocks are provided each having a structure in which a portion to be sealed of components including at least one chip mounting board having a front surface that is a chip mounting surface and a back surface that is at least partly an exposed surface, a semiconductor chip mounted to the front surface of each chip mounting board, and a plurality of leads provided correspondingly to each chip mounting board and having inner lead portions connected to an electrode of the semiconductor chip on the corresponding chip mounting board via a connecting wire is embedded in a resin molded portion molded into a generally plate shape, and outer lead portions of said plurality of leads are led out in line from a side surface at one end in a width direction of said resin molded portion, and the exposed surface of each chip mounting board is placed on one surface of said resin molded portion, said pair of blocks are mechanically connected by a connecting portion with the side surfaces from which outer leads of the resin molded portions are drawn out facing each other, and the outer lead portions led out of said pair of blocks are drawn out through a gap formed between the resin molded portions of said pair of blocks; and a radiator plate that is shared by the pair of blocks of said resin sealing semiconductor device and connected to the exposed surfaces of the chip mounting boards of both the blocks in a heat transfer manner, wherein a plurality of positioning protrusions are provided on one surface of the resin molded portion of each block of said resin sealing semiconductor device, and said positioning protrusions are abutted against said radiator plate to form a gap between the exposed surface of the chip mounting board of each block and the radiator plate, and the gap between the exposed surface of the chip mounting board of said each block and the radiator plate is filled with insulating and bonding resin to bond the exposed surface of the chip mounting board of each block to said radiator plate.

9. An electronic device comprising:

a resin sealing semiconductor device in which a pair of semiconductor device comprising blocks are provided each having a structure in which a portion to be sealed of components including a plurality of chip mounting boards each having a front surface that is a chip mounting surface and a back surface that is at least partly an exposed surface and arranged in line on one plane, a semiconductor chip mounted to the front surface of each chip mounting board, and a plurality of leads provided correspondingly to each chip mounting board and having inner lead portions connected to an electrode of the semiconductor chip on the corresponding chip mounting board via a connecting wire is embedded in a resin molded portion molded into a generally horizontally oriented plate shape, and outer lead portions of said plurality of leads are led out in line in a longitudinal direction of the resin molded portion from a side surface at one end in a width direction of said resin molded portion, and an exposed surface of each chip mounting board is placed on one surface of said resin molded portion, said pair of blocks are mechanically connected by a connecting portion with the side surfaces from which outer leads of the resin molded portions are drawn out facing each other, and the outer lead portions led out of said pair of blocks are drawn out through a gap formed between said pair of blocks; and a radiator plate that is shared by the pair of blocks of said resin sealing semiconductor device and connected to the exposed surfaces of the chip mounting boards of both the blocks in a heat transfer manner, wherein each block is comprised so that a warp with said one surface of the resin molded portion of each block being a projecting surface occurs in each block under a temperature environment in bonding the exposed surface of the chip mounting board of each block to said radiator plate, by a difference in thermal expansion coefficient between one surface of the resin molded portion of each block and the other surface of the resin molded portion of each block, positioning protrusions that abut against said radiator plate are provided near opposite ends of two sides extending in a longitudinal direction of at least one surface of the resin molded portion of each block, and a height of each positioning protrusion is set so that a gap is formed between each part of the exposed surface of the chip mounting board of each block and said radiator plate, and the gap formed between each part of the exposed surface of the chip mounting board of each block of said resin sealing semiconductor device and said radiator plate is filled with insulating and bonding resin to bond the exposed surface of the chip mounting board of each block to said radiator plate.

10. An electronic device comprising:

a resin sealing semiconductor device in which a pair of semiconductor device comprising blocks are provided each having a structure in which a portion to be sealed of components including three chip mounting boards each having a front surface that is a chip mounting surface and a back surface that is at least partly an exposed surface and arranged in line on one plane, a three-phase semiconductor chip mounted to the front surfaces of said three chip mounting boards, and a plurality of leads provided correspondingly to each chip mounting board and having inner lead portions connected to an electrode of the semiconductor chip on the corresponding chip mounting board via a connecting wire is embedded in a resin molded portion molded into a substantially rectangular plate shape long in an arranging direction of said three chip mounting boards, and outer lead portions of said plurality of leads are led out in line in a longitudinal direction of said resin molded portion from a side surface at one end in a width direction of said resin molded portion, and an exposed surface of each chip mounting board is placed on one surface of said resin molded portion, said pair of blocks are mechanically connected by a connecting portion with the side surfaces from which outer leads of the resin molded portions are drawn out facing each other, the outer lead portions led out of said pair of blocks are drawn out through a gap formed between the resin molded portions of said pair of blocks, and the semiconductor chips in said pair of blocks are connected so as to comprise a three-phase bridge circuit; and a radiator plate that is shared by the pair of blocks of said resin sealing semiconductor device and connected to the exposed surfaces of the chip mounting boards of both the blocks in a heat transfer manner, wherein each block of said resin sealing semiconductor device is comprised so that a warp with said one surface of the resin molded portion of each block being a projecting surface occurs in each block under a temperature environment in bonding the exposed surface of the chip mounting board of each block to the radiator plate, by a difference in thermal expansion coefficient between one surface of the resin molded portion of each block and the other surface of the resin molded portion of each block of said resin sealing semiconductor device, positioning protrusions that abut against said radiator plate are provided near opposite ends of two sides extending in a longitudinal direction of at least one surface of the resin molded portion of each block, and a height of each positioning protrusion is set so that a gap is formed between each part of the exposed surface of the chip mounting board of each block and said radiator plate, and the gap formed between each part of the exposed surface of the chip mounting board of each block of said resin sealing semiconductor device and said radiator plate is filled with insulating and bonding resin to bond the exposed surface of the chip mounting board of each block to said radiator plate.

11. The resin sealing semiconductor device according to claim 9 or 10, wherein said positioning protrusions are provided so that the gap between the exposed surface of said chip mounting board and the radiator plate becomes the narrowest in a middle portion in the longitudinal direction of each block, and gradually becomes wider toward opposite ends in the longitudinal direction of each block.

12. The electronic device according to claim 9 or 10, wherein said radiator plate has a recessed surface curving at substantially the same curvature as a facing projecting surface in a region facing one surface that warps to form the projecting surface, of the resin molded portion of each block of said resin sealing semiconductor device, and a gap having a substantially uniform size over the entire exposed surface of the chip mounting board of each block is formed between the exposed surface of the chip mounting board of each block of said resin sealing semiconductor device and the recessed surface provided in said radiator plate.

13. An electronic device comprising:

a resin sealing semiconductor device in which a pair of semiconductor device comprising blocks are provided each having a structure in which a portion to be sealed of components including a plurality of chip mounting boards each having a front surface that is a chip mounting surface and a back surface that is at least partly an exposed surface and arranged in line on one plane, a semiconductor chip mounted to the front surface of each chip mounting board, and a plurality of leads provided correspondingly to each chip mounting board and having inner lead portions connected to an electrode of the semiconductor chip on the corresponding chip mounting board via a connecting wire is embedded in a resin molded portion molded into a generally horizontally oriented plate shape, and outer lead portions of said plurality of leads are led out in line in a longitudinal direction of the resin molded portion from a side surface at one end in a width direction of said resin molded portion, and an exposed surface of each chip mounting board is placed on one surface of said resin molded portion, said pair of blocks are mechanically connected by a connecting portion with the side surfaces from which outer leads of the resin molded portions are drawn out facing each other, and the outer lead portions led out of said pair of blocks are drawn out through a gap formed between said pair of blocks; and a radiator plate that is shared by the pair of blocks of said resin sealing semiconductor device and connected to the exposed surfaces of the chip mounting boards of both the blocks in a heat transfer manner, wherein positioning protrusions that abut against said radiator plate are provided near opposite ends of two sides extending in a longitudinal direction of at least one surface of the resin molded portion of each block, and a height of each positioning protrusion is set so that a gap is formed between each part of the exposed surface of the chip mounting board of each block and said radiator plate, a series of outer leads of said resin sealing semiconductor device are led out on a side opposite from said radiator plate, and soldered to a circuit board placed on two blocks of said resin sealing semiconductor device, an insulation sheet is inserted into the gap formed between each part of the exposed surface of the chip mounting board of each block of said resin sealing semiconductor device and said radiator plate, and said circuit board is fastened to said radiator plate, and said resin sealing semiconductor device is secured to said radiator plate while being pressed by said circuit board.

14. An electronic device comprising:

a resin sealing semiconductor device in which a pair of semiconductor device comprising blocks are provided each having a structure in which a portion to be sealed of components including a plurality of chip mounting boards each having a front surface that is a chip mounting surface and a back surface that is at least partly an exposed surface and arranged in line on one plane, a semiconductor chip mounted to the front surface of each chip mounting board, and a plurality of leads provided correspondingly to each chip mounting board and having inner lead portions connected to an electrode of the semiconductor chip on the corresponding chip mounting board via a connecting wire is embedded in a resin molded portion molded into a generally horizontally oriented plate shape, and outer lead portions of said plurality of leads are led out in line in a longitudinal direction of the resin molded portion from a side surface at one end in a width direction of said resin molded portion, and an exposed surface of each chip mounting board is placed on one surface of said resin molded portion, said pair of blocks are mechanically connected by a connecting portion with the side surfaces from which outer leads of the resin molded portions are drawn out facing each other, and the outer lead portions led out of said pair of blocks are drawn out through a gap formed between said pair of blocks; and a radiator plate that is shared by the pair of blocks of said resin sealing semiconductor device and connected to the exposed surfaces of the chip mounting boards of both the blocks in a heat transfer manner, wherein positioning protrusions that abut against said radiator plate are provided near opposite ends of two sides extending in a longitudinal direction of at least one surface of the resin molded portion of each block, and a height of each positioning protrusion is set so that a gap is formed between each part of the exposed surface of the chip mounting board of each block and said radiator plate, two presser plates are placed on surfaces on a side opposite from said radiator plate of two blocks of said resin sealing semiconductor device,
an insulation sheet is inserted into the gap formed between each part of the exposed surface of the chip mounting board of each block of said resin sealing semiconductor device and said radiator plate, and
said two presser plates are fastened to said radiator plate, and the two blocks of said resin sealing semiconductor device are secured to said radiator plate while being pressed against said radiator plate.

* * * * *